US 9,383,460 B2

(12) United States Patent
McAninch et al.

(10) Patent No.: US 9,383,460 B2
(45) Date of Patent: Jul. 5, 2016

(54) BEAM IMAGING SENSOR

(71) Applicant: Babcock & Wilcox Nuclear Operations Group, Inc., Lynchburg, VA (US)

(72) Inventors: Michael D. McAninch, Goode, VA (US); Jeffrey J. Root, Columbus, OH (US)

(73) Assignee: BWXT Nuclear Operations Group, Inc., Lynchburg, VA (US)

( * ) Notice: Subject to any disclaimer, the term of this patent is extended or adjusted under 35 U.S.C. 154(b) by 0 days.

(21) Appl. No.: 13/826,907

(22) Filed: Mar. 14, 2013

(65) Prior Publication Data

US 2013/0299700 A1   Nov. 14, 2013

Related U.S. Application Data

(60) Provisional application No. 61/646,627, filed on May 14, 2012.

(51) Int. Cl.
*G01T 1/29* (2006.01)
*B23K 15/00* (2006.01)
*H01J 37/244* (2006.01)

(52) U.S. Cl.
CPC ........... *G01T 1/2921* (2013.01); *B23K 15/0026* (2013.01); *H01J 37/244* (2013.01); *H01J 2237/24405* (2013.01); *H01J 2237/24507* (2013.01); *H01J 2237/3104* (2013.01)
USPC ......... 250/300; 250/354; 250/397; 250/426 R

(58) Field of Classification Search
USPC .................. 250/300, 336.1, 354, 397, 423 R
See application file for complete search history.

(56) References Cited

U.S. PATENT DOCUMENTS

| | | |
|---|---|---|
| 3,202,915 A | 8/1965 | Baldwin et al. |
| 3,219,873 A | 11/1965 | Kaufman |
| 3,437,915 A | 4/1969 | Russell |
| 3,691,341 A | 9/1972 | Roiron et al. |
| 4,127,762 A | 11/1978 | Paton et al. |
| 4,135,088 A | 1/1979 | Ishikawa et al. |
| 4,223,200 A | 9/1980 | Moench et al. |
| 4,309,589 A | 1/1982 | Hashimoto et al. |
| 4,333,067 A | 6/1982 | Kugimiya et al. |
| 4,335,304 A | 6/1982 | Palmberg |
| 4,348,576 A | 9/1982 | Anderl et al. |

(Continued)

FOREIGN PATENT DOCUMENTS

JP   H04147551   5/1992

OTHER PUBLICATIONS

PCT Search Report Dated Sep. 24, 2013 for corresponding PCT Application No. PCT/US2013/040928.

(Continued)

*Primary Examiner* — Phillip A Johnston
*Assistant Examiner* — Hsien Tsai
(74) *Attorney, Agent, or Firm* — Nelson Mullins Riley & Scarborough, LLP

(57) ABSTRACT

The present invention relates generally to the field of sensors for beam imaging and, in particular, to a new and useful beam imaging sensor for use in determining, for example, the power density distribution of a beam including, but not limited to, an electron beam or an ion beam. In one embodiment, the beam imaging sensor of the present invention comprises, among other items, a circumferential slit that is either circular, elliptical or polygonal in nature.

111 Claims, 15 Drawing Sheets

(56) References Cited

U.S. PATENT DOCUMENTS

| | | | |
|---|---|---|---|
| 4,357,517 A | 11/1982 | de Sivry et al. |
| 4,357,536 A | 11/1982 | Varma et al. |
| 4,371,774 A | 2/1983 | Strathman et al. |
| 4,433,243 A | 2/1984 | Nakamura et al. |
| 4,455,532 A | 6/1984 | Gregory et al. |
| 4,467,205 A | 8/1984 | Beisswenger et al. |
| 4,567,345 A | 1/1986 | Bachet et al. |
| 4,587,433 A | 5/1986 | Farley |
| 4,633,172 A | 12/1986 | Ekdahl, Jr. et al. |
| 4,636,968 A | 1/1987 | Gotou et al. |
| 4,643,587 A | 2/1987 | Makabe et al. |
| 4,654,506 A | 3/1987 | Sakamoto et al. |
| 4,673,794 A | 6/1987 | Irie et al. |
| 4,687,987 A | 8/1987 | Kuchnir et al. |
| 4,751,393 A | 6/1988 | Corey, Jr. et al. |
| 4,794,259 A | 12/1988 | Sanderson et al. |
| 4,845,370 A | 7/1989 | Thompson et al. |
| 4,857,742 A | 8/1989 | Kato et al. |
| 4,897,545 A | 1/1990 | Danilatos |
| 4,939,371 A | 7/1990 | Goto |
| 5,075,532 A | 12/1991 | Wakabayashi |
| 5,120,968 A | 6/1992 | Fiorito et al. |
| 5,153,430 A | 10/1992 | Gammel et al. |
| 5,294,771 A | 3/1994 | Pratt |
| 5,334,846 A | 8/1994 | Nakano et al. |
| 5,382,895 A * | 1/1995 | Elmer et al. ............... 324/71.3 |
| 5,401,973 A | 3/1995 | McKeown et al. |
| 5,440,210 A | 8/1995 | Bogaty et al. |
| 5,448,173 A | 9/1995 | Shinohara et al. |
| 5,449,916 A | 9/1995 | Smyth et al. |
| 5,451,794 A | 9/1995 | McKeown et al. |
| 5,468,966 A | 11/1995 | Elmer et al. |
| 5,483,036 A | 1/1996 | Giedt et al. |
| 5,534,677 A | 7/1996 | Elmer et al. |
| 5,554,926 A | 9/1996 | Elmer et al. |
| 5,570,175 A | 10/1996 | Dobele et al. |
| 5,583,427 A | 12/1996 | Teruya et al. |
| 5,612,588 A | 3/1997 | Wakalopulos |
| 5,644,132 A | 7/1997 | Litman et al. |
| 5,644,220 A | 7/1997 | Urs et al. |
| 5,726,919 A | 3/1998 | Azad et al. |
| 5,760,573 A | 6/1998 | Paranjpe et al. |
| 5,773,784 A | 6/1998 | Noguchi et al. |
| 5,909,032 A | 6/1999 | Wakalopulos |
| 5,986,263 A | 11/1999 | Hiroi et al. |
| 6,034,781 A | 3/2000 | Sarfaty et al. |
| 6,300,643 B1 | 10/2001 | Fang et al. |
| 6,300,750 B1 | 10/2001 | Oglesbee et al. |
| 6,300,755 B1 | 10/2001 | Elmer et al. |
| 6,429,444 B1 | 8/2002 | Korenev et al. |
| 6,452,165 B1 * | 9/2002 | Schwieters ............... 250/283 |
| 6,504,163 B2 | 1/2003 | Takayama et al. |
| 6,541,780 B1 | 4/2003 | Richards et al. |
| 6,541,982 B2 | 4/2003 | Kitagawa et al. |
| 6,573,471 B1 | 6/2003 | Kuriyama et al. |
| 6,590,216 B1 | 7/2003 | Doran et al. |
| 6,617,596 B1 | 9/2003 | Korenev |
| 6,657,212 B2 | 12/2003 | Komori et al. |
| 6,693,290 B2 | 2/2004 | Yamaguchi |
| 6,822,247 B2 | 11/2004 | Sasaki |
| 6,870,174 B2 | 3/2005 | Yamaguchi et al. |
| 6,881,969 B2 | 4/2005 | Yamaguchi |
| 6,888,090 B2 | 5/2005 | Murphy |
| 6,972,551 B2 | 12/2005 | Havener et al. |
| 6,977,382 B2 * | 12/2005 | Lower ............... 250/397 |
| 7,012,419 B2 | 3/2006 | Deibele |
| 7,015,703 B2 | 3/2006 | Hopkins et al. |
| 7,019,543 B2 | 3/2006 | Quon |
| 7,023,002 B2 | 4/2006 | Nagaseki et al. |
| 7,038,364 B2 | 5/2006 | Yamaguchi et al. |
| 7,148,613 B2 | 12/2006 | Dally et al. |
| 7,161,352 B2 | 1/2007 | Sasaki |
| 7,195,936 B2 | 3/2007 | Onishi et al. |
| 7,244,950 B2 | 7/2007 | Elmer et al. |
| 7,279,882 B1 | 10/2007 | Degtiarenko et al. |
| 7,282,709 B2 | 10/2007 | Darling et al. |
| 7,288,772 B2 | 10/2007 | Elmer et al. |
| 7,288,942 B2 | 10/2007 | Zhang et al. |
| 7,339,180 B2 | 3/2008 | Kitchen |
| 7,345,436 B2 | 3/2008 | Sellmair |
| 7,348,568 B2 | 3/2008 | Elmer et al. |
| 7,368,739 B2 | 5/2008 | Kristiansson et al. |
| 7,378,830 B2 | 5/2008 | Teruya et al. |
| 7,413,672 B1 | 8/2008 | Keil |
| 7,425,714 B2 | 9/2008 | Sakakibara et al. |
| 7,435,970 B2 | 10/2008 | Watanabe et al. |
| 7,521,691 B2 | 4/2009 | Dzengeleski et al. |
| 7,564,048 B2 | 7/2009 | Dzengeleski et al. |
| 7,619,223 B2 | 11/2009 | Sasaki et al. |
| 7,645,994 B2 | 1/2010 | Tang et al. |
| 7,692,390 B2 | 4/2010 | Zosel |
| 7,696,488 B2 | 4/2010 | Liu et al. |
| 7,696,497 B2 | 4/2010 | Rogers |
| 7,875,860 B2 | 1/2011 | Koehn et al. |
| 7,888,937 B2 | 2/2011 | Watanabe et al. |
| 7,902,503 B2 | 3/2011 | Teruya et al. |
| 8,040,138 B2 | 10/2011 | Sugai et al. |
| 8,063,626 B2 | 11/2011 | Solar et al. |
| 8,076,658 B2 | 12/2011 | Vokurka |
| 8,278,909 B2 | 10/2012 | Fletcher |
| 8,344,281 B2 | 1/2013 | Taminger et al. |
| 8,350,556 B2 | 1/2013 | Knuffman et al. |
| 8,415,942 B2 | 4/2013 | Fletcher |
| 8,427,168 B2 | 4/2013 | Tatsumi et al. |
| 8,481,961 B2 | 7/2013 | Kireeff Covo |
| 8,513,562 B2 | 8/2013 | Bichsel |
| 8,530,851 B2 | 9/2013 | Abgaryan et al. |
| 8,546,717 B2 | 10/2013 | Stecker |
| 8,598,485 B2 | 12/2013 | Adachi |
| 8,598,523 B2 | 12/2013 | Stecker et al. |
| 2002/0129902 A1 | 9/2002 | Babayan et al. |
| 2005/0242299 A1 | 11/2005 | Elmer et al. |
| 2005/0285047 A1 | 12/2005 | Elmer et al. |
| 2006/0038139 A1* | 2/2006 | Elmer ............... B23K 15/0026 250/492.23 |
| 2006/0192144 A1 | 8/2006 | Schubert et al. |
| 2006/0196853 A1 | 9/2006 | Elmer et al. |
| 2007/0210041 A1 | 9/2007 | Elmer et al. |
| 2007/0246785 A1 | 10/2007 | Krijnen |
| 2008/0088295 A1 | 4/2008 | Teruya et al. |
| 2008/0295962 A1 | 12/2008 | Endo et al. |
| 2009/0146082 A1* | 6/2009 | Stengl et al. ............... 250/492.22 |
| 2010/0032562 A1* | 2/2010 | Teruya et al. ............... 250/305 |
| 2011/0061591 A1 | 3/2011 | Stecker |
| 2011/0114839 A1 | 5/2011 | Stecker et al. |
| 2011/0121180 A1* | 5/2011 | Elmer ............... H01J 37/244 250/336.1 |
| 2012/0232817 A1 | 9/2012 | O'Sullivan et al. |
| 2012/0283973 A1 | 11/2012 | Samara et al. |
| 2013/0057250 A1 | 3/2013 | Kopalidis et al. |
| 2013/0146567 A1 | 6/2013 | Graf et al. |
| 2013/0158961 A1 | 6/2013 | Imazaw |
| 2013/0299700 A1 | 11/2013 | McAninch et al. |
| 2014/0014629 A1 | 1/2014 | Stecker |
| 2014/0061167 A1 | 3/2014 | Stecker et al. |

OTHER PUBLICATIONS

European Search Report dated Jan. 5, 2016 for EP Application No. 13790417.3.

* cited by examiner

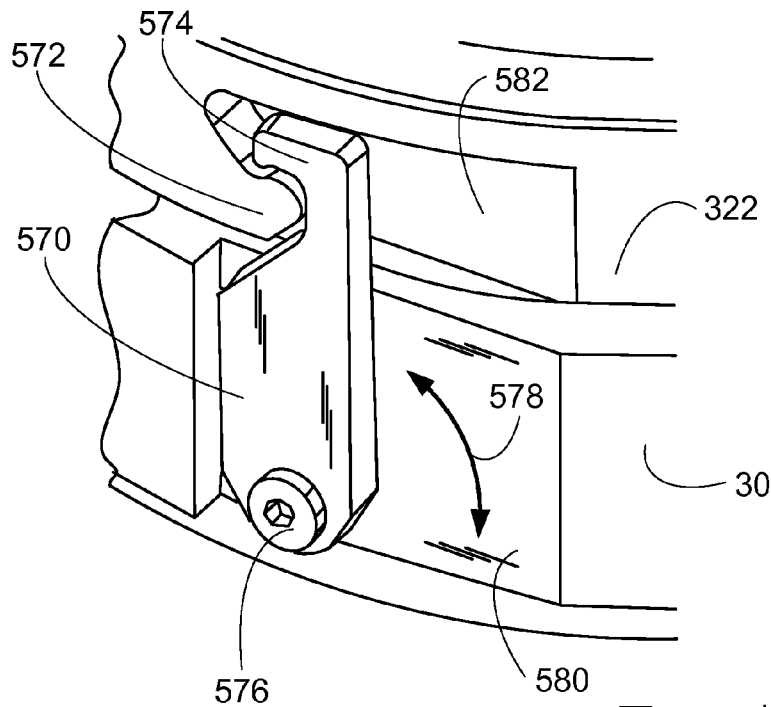
FIG. 9
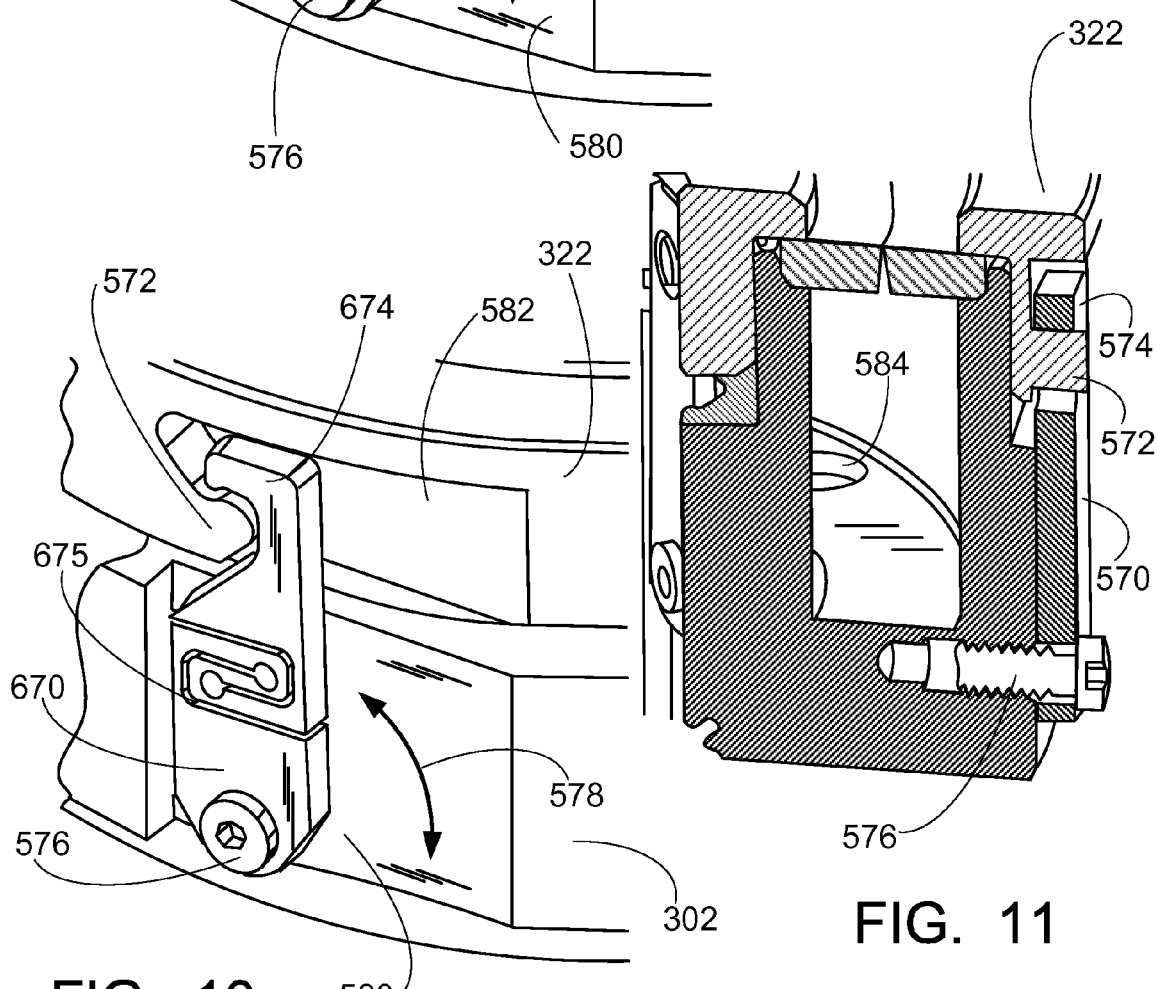
FIG. 10
FIG. 11

INDEXED 120°

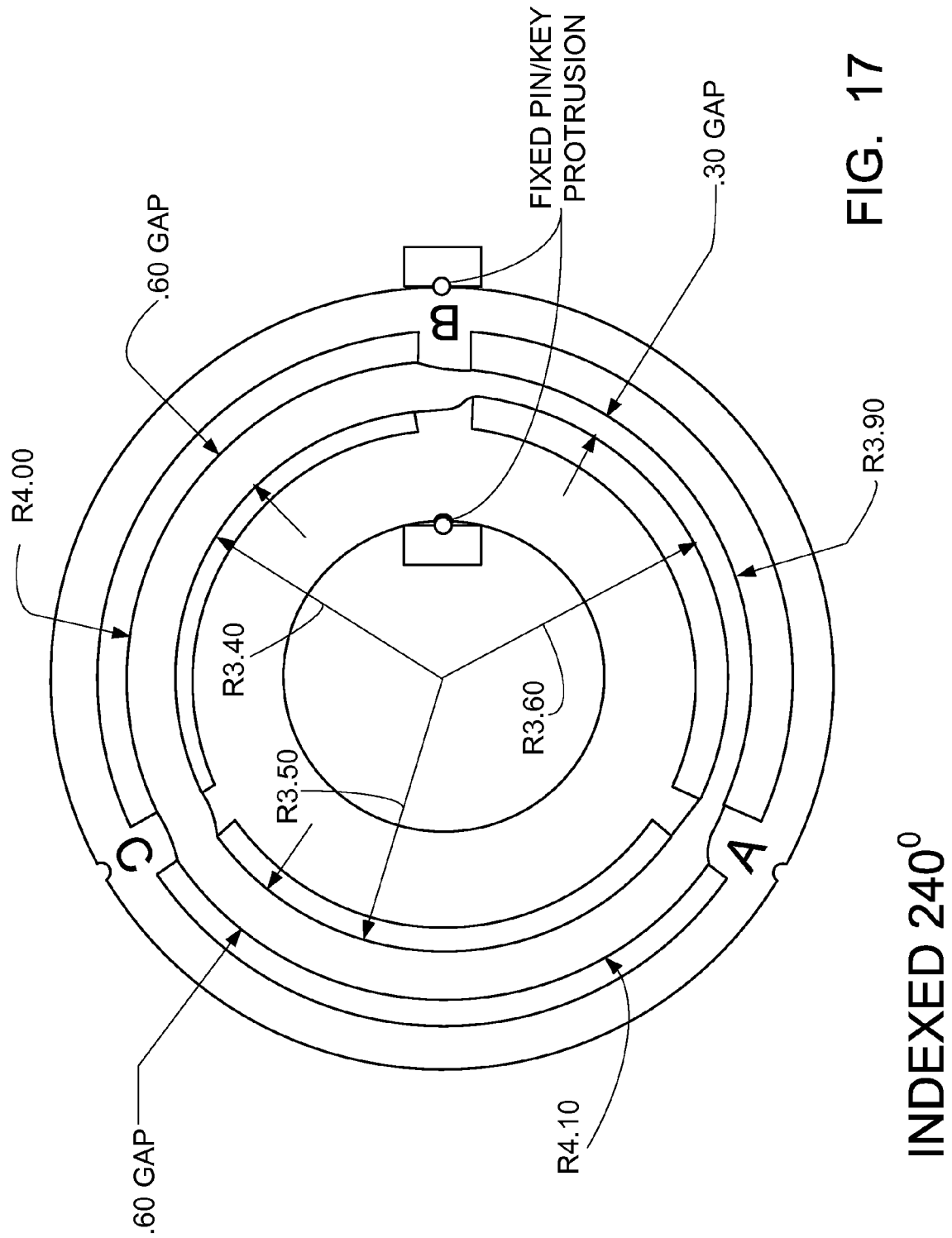

BEAM IMAGING SENSOR

RELATED APPLICATION DATA

This patent application claims priority to U.S. Provisional Patent Application No. 61/646,627 filed May 14, 2012 and titled "Beam Imaging Sensor." The complete text of this application is hereby incorporated by reference as though fully set forth herein in its entirety.

GOVERNMENT RIGHTS

This invention was made with Government support under Contract No. DE-AC11-07PN38361(A) awarded by the Department of Energy. The Government has certain rights in this invention.

FIELD AND BACKGROUND OF THE INVENTION

1. Field of the Invention

The present invention relates generally to the field of sensors for beam imaging and, in particular, to a new and useful beam imaging sensor for use in determining, for example, the power density distribution of a beam including, but not limited to, an electron beam or an ion beam. In one embodiment, the beam imaging sensor of the present invention comprises, among other items, a circumferential slit that is either circular, elliptical or polygonal in nature.

2. Description of the Related Art

Electron beams are considered to be the most precise and clean method available for welding thick sections of materials. Unfortunately, electron beams suffer one critical deficiency, namely the repeatability of focusing the beam to a known power density. Without the ability to reliably reproduce the power distribution in an electron beam, weld quality cannot be guaranteed. This problem is exacerbated by the fact the many welds are made over a period of time and with different welding operators. Further complications arise when welds are developed on one machine than transferred to a different machine for production. Various electron beam diagnostic methods have been developed that, at some level, enable the characterization of the power density distribution in high power electron beams. Such diagnostic methods are exemplified by U.S. Pat. Nos. 5,382,895; 5,468,966; 5,554, 926; 5,583,427; 6,300,755; 7,288,772; 7,348,568; 7,378,830; and 7,902,503. However, the methods and sensors disclosed therein all suffer from a number of drawbacks. While not wishing to be bound to any one drawback, some, if not all, of the prior art sensors suffer from thermal load drawbacks that cause the sensors of the prior art to fail at lower energy levels (e.g., 5 kW).

Given the above, a need exists for a beam imaging sensor that provides superior functionality and accuracy while still being able to withstand beam energy settings in excess of 5 kW.

SUMMARY OF THE INVENTION

The present invention relates generally to the field of sensors for beam imaging and, in particular, to a new and useful beam imaging sensor for use in determining, for example, the power density distribution of a beam including, but not limited to, an electron beam or an ion beam. In one embodiment, the beam imaging sensor of the present invention comprises, among other items, a circumferential slit that is either circular, elliptical or polygonal in nature.

Accordingly, one aspect of the present invention is drawn to a beam imaging sensor comprising: a cylindrically-shaped sensor body, wherein the sensor body has a top end and a bottom end, the top end having at least one channel formed therein; a Faraday cup located within the at least one channel, the Faraday cup being positioned to receive at least a portion of an electron, or ion, beam; an inner slit disc and an outer slit disc positioned at the top end of the least one channel so as to be positioned above the Faraday cup, the inner and outer slit discs being able to nest together to form a slit there between and where the slit so formed permits the passage of at least a portion of an electron, or ion, beam to the Faraday cup located there below; and at least one conductive lead in electrical communication with the Faraday cup, the at least one conductive lead being able to conduct an electrical signal generated by the portion of the beam that comes into contact with the Faraday cup.

In yet another aspect of the present invention, there is provided a beam imaging sensor comprising: a cylindrically-shaped sensor body, wherein the sensor body has a top end and a bottom end, the top end having at least one channel formed therein; a cylindrically-shaped electronics enclosure, wherein the electronics enclosure has a top end and a bottom end, the top end of the electronics enclosure being coupled to the bottom end of the sensor body; a Faraday cup located within the at least one channel, the Faraday cup being positioned to receive at least a portion of an electron, or ion, beam; an inner slit disc and an outer slit disc positioned at the top end of the least one channel so as to be positioned above the Faraday cup, the inner and outer slit discs being able to nest together to form a slit there between and where the slit so formed permits the passage of at least a portion of an electron, or ion, beam to the Faraday cup located there below; and at least one conductive lead in electrical communication with the Faraday cup, the at least one conductive lead being able to conduct an electrical signal generated by the portion of the beam that comes into contact with the Faraday cup.

In yet another aspect of the present invention, there is provided a beam imaging sensor comprising: a cylindrically-shaped sensor body, wherein the sensor body has a top end and a bottom end, the top end having at least one channel formed therein; a cylindrically-shaped electronics enclosure, wherein the electronics enclosure has a top end and a bottom end, the top end of the electronics enclosure being coupled to the bottom end of the sensor body; a cylindrically-shaped clamp ring body and a cylindrically-shaped lower clamp ring, wherein the clamp ring body and the clamp ring are coupled to one another and together have a top end and a bottom end, the top end of the coupled structure being coupled to the bottom end of the electronics enclosure; a Faraday cup located within the at least one channel, the Faraday cup being positioned to receive at least a portion of an electron, or ion, beam; an inner slit disc and an outer slit disc positioned at the top end of the least one channel so as to be positioned above the Faraday cup, the inner and outer slit discs being able to nest together to form a slit there between and where the slit so formed permits the passage of at least a portion of an electron, or ion, beam to the Faraday cup located there below; and at least one conductive lead in electrical communication with the Faraday cup, the at least one conductive lead being able to conduct an electrical signal generated by the portion of the beam that comes into contact with the Faraday cup.

In yet another aspect of the present invention, there is provided a beam imaging sensor as shown and described herein, and/or a beam imaging sensor as shown and described in any of the Figures attached hereto. In still another aspect of the present invention, there is provided a method of utilizing a beam imaging sensor as shown and described herein.

The various features of novelty which characterize the invention are pointed out with particularity in the claims annexed to and forming a part of this disclosure. For a better understanding of the invention, its operating advantages and specific benefits attained by its uses, reference is made to the accompanying drawings and descriptive matter in which exemplary embodiments of the invention are illustrated.

BRIEF DESCRIPTION OF THE DRAWINGS

FIG. 9 is a close-up illustration of a side portion of beam sensor 300 illustrating an alternative attachment means for securing outer clamp ring 322 to sensor body 302;

FIG. 10 is a close-up illustration of a side portion of beam sensor 300 illustrating another alternative attachment means for securing outer clamp ring 322 to sensor body 302;

FIG. 11 is a close-up cut away illustration of beam sensor 300 illustrating one possible attachment means for securing one or more clamp arms to sensor body 302 so as to facilitate securing outer clamp ring 322 to sensor body 302;

FIGS. 15 through 17 are partial illustration of another set of nesting slit discs according to still yet another embodiment of the present invention.

DESCRIPTION OF THE INVENTION

While the present invention will be described in terms of an electron beam, or ion beam, the present invention is not limited thereto. Rather, the beam imaging sensor of the present invention can be utilized in any situation where one wants to ascertain the power density distribution of a beam of energy.

As noted above, the present invention relates generally to the field of sensors for beam imaging and, in particular, to a new and useful beam imaging sensor for use in determining, for example, the power density distribution of a beam including, but not limited to, an electron beam or an ion beam. In one embodiment, the beam imaging sensor of the present invention comprises, among other items, a circumferential slit that is either circular, elliptical or polygonal (be it a regular polygon or an irregular polygon) in nature. As utilized herein the word "circumferential" denotes the location and/or positioning of the slit in the present invention relative various other parts of the beam imaging sensor. The word "circumferential" does not however limit the geometrical shape of the slit in the beam imaging sensor of the present invention.

Figure 1:
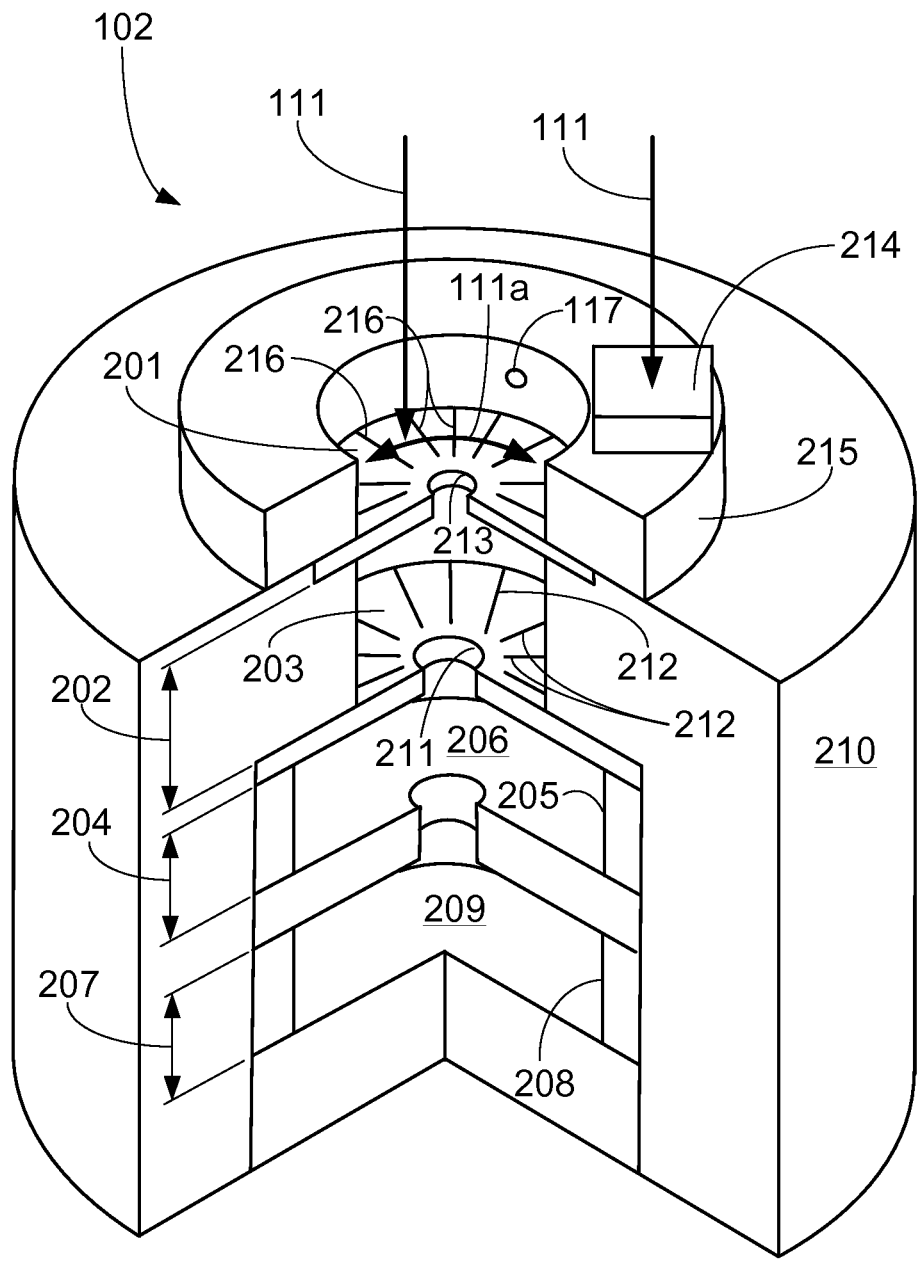
FIG. 1 is a partial cut-away illustration of a beam imaging sensor of the prior art.

Turning to FIG. 1, FIG. 1 is an illustration of a prior art beam imaging sensor 102 having a modified Faraday cup (MFC). As can be seen in FIG. 1, the modified Faraday cup (MFC) imaging sensor 102 is subjected to a high power beam 111. As illustrated in FIG. 1, MFC sensor 102 includes a slit disk assembly 201, a conducting disk 203 located below the slit disk assembly 201, a Faraday cup assembly 206 located below the conducting disk 203, and a start-stop target 214 located proximate the slit disk assembly 201. A multiplicity of circumferential radial slits 216 and a trigger probe 117 are located in the slit disk assembly 201. A desired number of circumferential radial slits 212 are located in the conducting disk 203. In order to keep the MFC sensor 102 from overheating during use, a heat sink is placed in close proximity to the components. An active cooling system, using water or other cooling fluid, can be further integrated into the heat sink.

When utilized in a diagnostic system as known to those of skill in the art, sensor 102 provides a manner by which to measure the power density distribution of a high power and high intensity electron, or ion, beam 111. During operation, the beam 111 is rotated about the central point of the slit disk assembly 201 over the aligned radial slits 216 and 212. Electrons or ions pass through the aligned radial slits 216 and 212 and are intercepted by the Faraday cup assembly 206 where they are detected and a signal is sent to the measuring and data acquisition system to measure the profile of the beam. Computed tomography can then be used to reconstruct the power density distribution of the beam 111.

In order to prevent damage to the tungsten slit disk assembly 201, the time over which the beam 111 comes in contact with the tungsten slit disk assembly 201 is reduced. In order to do this, the target block 214 is located to the side of the tungsten slit disk assembly 201. The target block 214 is made of a refractory metal. The beam 111 is first directed onto the target block 214 as illustrated in FIG. 1, and then the beam is translated to the radial slits 216, where it is translated in a circle indicated at 111a for a minimum number of rotations and then translated back onto the target block 214. The trigger probe 117 initiates the overall measuring system (not pictured). This is accomplished by trigger probe 117 sensing scattered electrons produced as the beam 111 passes through a region between slits 216 and directly in front of trigger probe 117.

The overall diagnostic system, an example of one such overall system can be found in U.S. Pat. No. 7,348,568, provides a system for rapidly measuring the power density distribution of an electron or an ion beam. The sensing system permits capture of various beam profiles in a fraction of a second as the beam is moved in a circular pattern over MFC sensor 102.

As noted above, the modified Faraday cup (MFC) sensor 102 includes a slit disk assembly 201, a space 202 between the slit disk assembly and conducting disk, a conducting disk 203, a space 204 between the conducting disk and the Faraday cup assembly, a spacer ring 205, a Faraday cup assembly 206, a space 207 between the Faraday cup assembly and the bottom plate, a spacer ring 208, a bottom plate 209, a heat sink 210, a hole 211 in the conducting disk, circumferential radial slits 212 in the conducting disk, a hole 213 in the slit disk assembly, a start-stop target 214, a mounting ring 215, a circumferential radial slits 216 in the slit disk assembly, and a trigger probe 117.

The slit disk assembly 201 of the MFC sensor 102 is made of an electrically conductive refractory material. Refractory materials are required to minimize damage to the slit disk assembly 201 by the high power beam 111. This material should also have a high average atomic number to intercept the beam 111, and be sufficiently thick to prevent the beam 111 from penetrating through to the underlying layers. In the embodiment shown in FIG. 1, the slit disk assembly 201 is made of tungsten.

During operation, the beam 111 is rotated about the central point of the slit disk assembly 201 over the aligned radial slits 216 and 212. Electrons or ions pass through the aligned radial slits 216 and 212 and are intercepted by the Faraday cup assembly 206 where they are detected and a signal is sent to the measuring and data acquisition system to measure the profile of the beam. Computed tomography can then be used to reconstruct the power density distribution of the beam 111.

As noted above, a system for characterizing a beam is operated by directing the beam onto the start/stop target; directing the beam onto the slit disk assembly; translating the beam to the radial slits wherein the beam enters the radial slits and conducting disk radial slits where it is detected by the Faraday cup; translating the beam onto the start/stop target.

Figure 2:
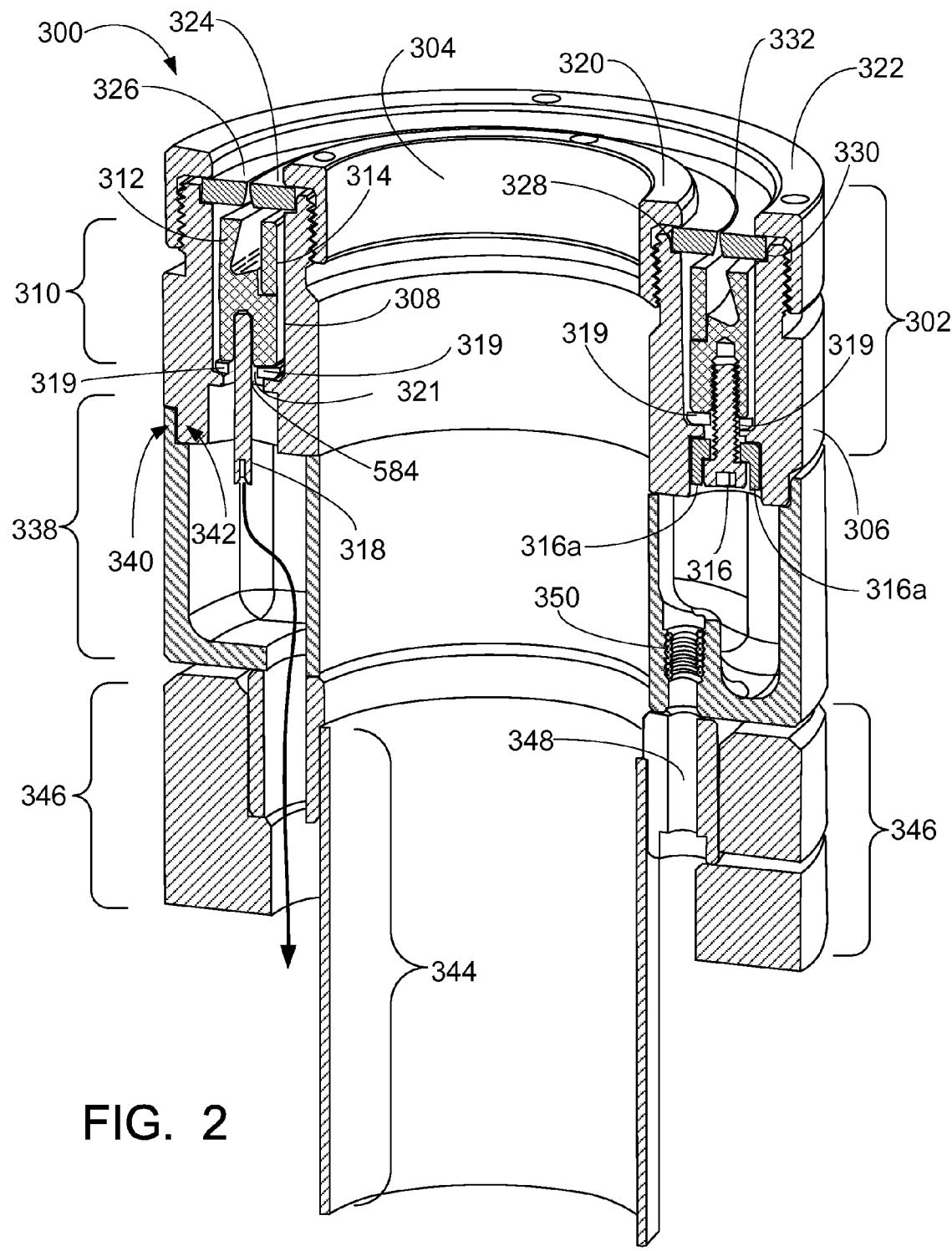
FIG. 2 is a partial cut-away illustration of a beam imaging sensor according to one embodiment of the present invention.
Figure 3:
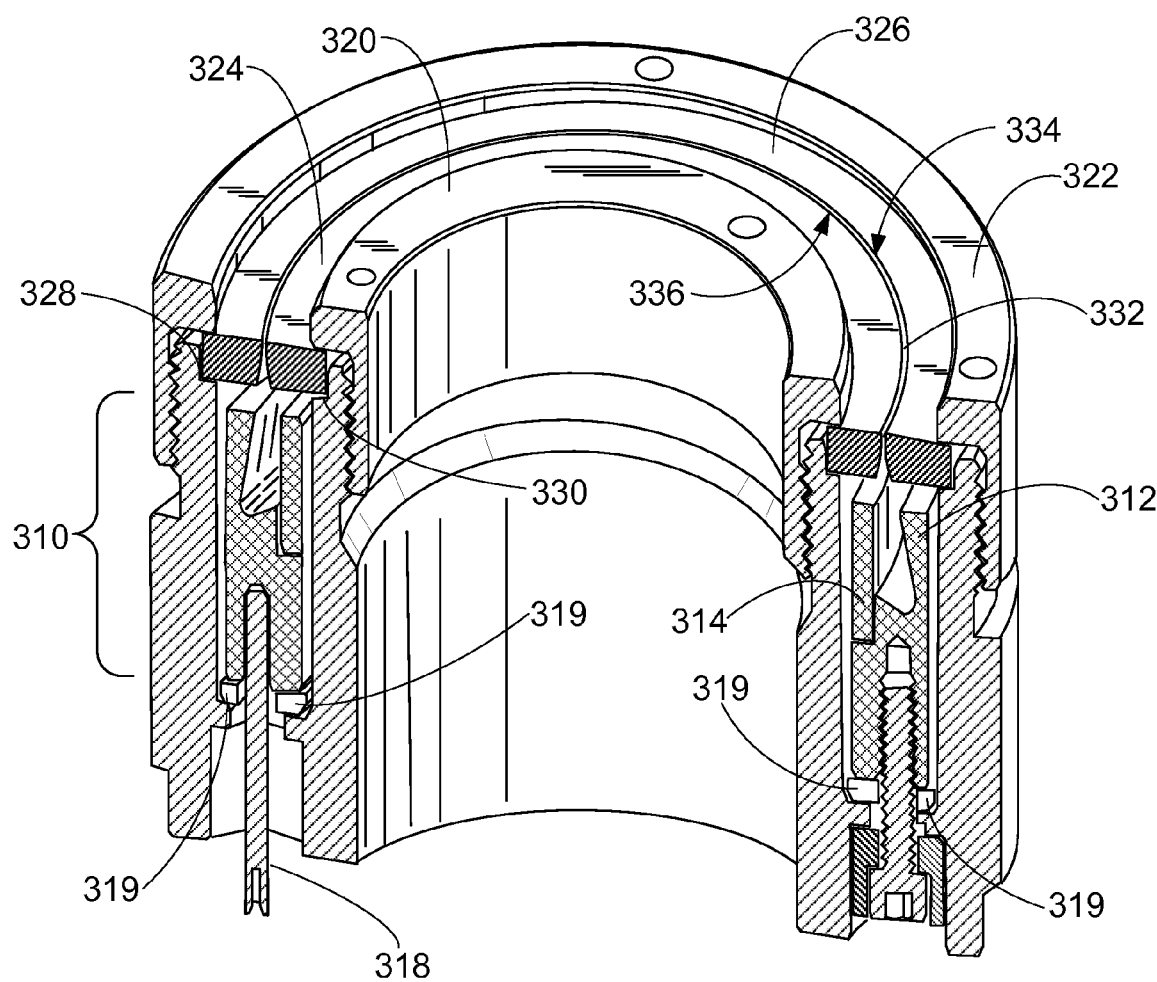
FIG. 3 is a partial close-up illustration of the top portion of the beam imaging sensor of FIG. 2.

Turning to FIGS. 2 and 3, FIGS. 2 and 3 illustrate a beam imaging sensor 300 according to one embodiment of the present invention. In one embodiment, beam imaging and/or profiling sensor 300 comprises an annular-shaped (or cylindrically-shaped) sensor body 302 having an inner diameter 304, an outer diameter 306 and a notched channel 308 formed therein. Notched channel 308 is designed to receive a modified Faraday cup (MFC) 310. As illustrated in FIG. 2, MFC 310 can be formed from one or more pieces of conductive material such as a conductive metal or conductive metal alloy (e.g., conductive metals such as copper, silver, gold, platinum, aluminum, etc.; or conductive metal alloys that contain one or more of copper, silver, gold, platinum, aluminum etc.). In another embodiment, the one or more metal pieces (e.g., 312 and 314) that form MFC 310 are formed from a brazed metal such as copper. As can be seen from FIG. 2, MFC 310 is held in place with at least one fastener 316 that is insulated via a corresponding fastener insulator 316a. MFC 310 is also in contact with MFC lead 318 that is formed from a conductive material similar to, or identical to, the material utilized to form MFC 310. MFC 310 is insulated from contact with the bottom of notched channel 308 via MFC insulator 319. As can be seen in FIG. 2, an opening, or hole, 321 is located in MFC insulator 319 to permit MFC lead 318 to pass there through and come into electrically conductive contact with MFC 310. In one embodiment, the one or more fastener insulators 316a and the MFC insulator 319 are independently formed from any material that can act as an electrical insulator and prevent the unwanted transmission of an electrical current. Suitable materials include, but are not limited to, one or more organic-based or inorganic-based insulating compounds, glass-epoxy insulators (e.g., G-10), ceramic insulators, or any combination of two or more thereof. Suitable insulating compounds include, but are not limited to, phenolic resin-based insulating compounds, polytetrafluoroethylene-based insulating compounds (i.e., Teflon®-based insulating compounds, polyoxymethylene (a.k.a., acetal, polyacetal and/or polyformaldehyde such as Delrin®), alumina insulating compounds (e.g., high purity alumina or alumina silicate), silicon-based insulating compounds (e.g., silicon nitride), insulating glass compounds (e.g., machineable borosilicate glasses such as Macor®).

As can be seen from FIG. 2 and/or FIG. 3, the top portion of sensor body 302 is threaded on both its interior cylindrical surface and exterior cylindrical surface in order to receive inner clamp ring 320 and outer clamp ring 322, respectively. It should be noted that the present invention is not limited to an embodiment having only threaded portions to retain inner clamp ring 320 and outer clamp ring 322. Rather, any suitable retention system and/or method can be utilized to secure inner clamp ring 320 and outer clamp ring 322 to the top portion of sensor body 302. Such suitable methods include, but are not limited to, compression fits, welds, adhesives, at least one physical attachment means (e.g., screws, rivets, bolts, tensioners, clamps, etc.), or any combination of two or more thereof. Regarding inner clamp ring 320 and outer clamp ring 322, these clamp rings are designed to secure concentrically nesting inner slit disc 324 and outer slit disc 326 in a set of notches and/or ledges 328 and 330 (or even in another embodiment channels) formed in the top edge surface of sensor body 302. As will be discussed in detail below with regard to various alternative embodiments of the present invention, only the inner edge of inner slit disc 324 and outer edge of outer slit disc 326 need to be circular in nature. The outer edge of inner slit disc 324 and the inner edge of outer slit disc 326 can be of any desirable geometric shape so long as these two edges match one another and permit nesting of the inner and outer slit discs 324 and 326, respectively, to yield and/or form a desirable gapped slit 332 as discussed in detail below.

As can be seen in FIGS. 2 and 3, positioned approximately equidistant between the inner diameter 304 and the outer diameter 306 of sensor body 302 is a circular circumferential slit 332 formed by the inner edge 334 of outer slit disc 326 and the outer edge 336 of inner slit disc 324. Slit 332 extends completely through the thickness of slit discs 324 and 326. Slit 332 permits energy from the ion/electron beam, when translated across the slit, to pass through the slit into MFC 310 thereby causing MFC 310 to produce a voltage signal which is proportional to the electrical current passing through slit 332 and into MFC 310. The electrical signal from MFC 310 is used to characterize the shape and power distribution of the subject beam via a signal captured and transmitted via MFC lead 318 through one or more wires (not pictured) attached to MFC lead 318. The one or more wires from MCF lead 318 are connected at the other end to a computer (not pictured) running suitable software as known to those of skill in the art for interpreting the signal/energy data captured by MFC 310. In one embodiment, the one or more wires from MFC lead 318 can be channeled as illustrated by the arrow of FIG. 2. However, the present invention is not limited to just this wiring route. In another embodiment, as is illustrated in FIGS. 2 and 3, slit 332 is formed so as to have a corresponding set of relief angles on the underside edge of slit 332. This can be seen in FIGS. 2 and 3 as the bottom portion of slit 332 is slight wider (or more open) than the top of slit 332. It should be noted that the present invention is not limited to just this type of top to bottom slit profile. Rather, any type of slit profile from top to bottom could be utilized herein. As such, some non-limiting examples include, but are not limited to, a slit 332 that is the same width from top to bottom, a slit 332 that is wider at the top and narrower at the bottom, or a slit 332 that is wider at the bottom and narrower at the top (i.e., similar to what is illustrated in FIGS. 2 and 3).

Turning to the remaining portions of beam imaging sensor 300, the bottom portion of sensor body 302 is formed to operatively couple to an annular-shaped (or cylindrically-shaped) electronics enclosure 338. As can be seen from FIG. 2, the bottom portion of sensor body 302 is fitted to electronics enclosure 338 via a flange 340 on the bottom edge of sensor body 302 and a lip 342 in the top edge of electronics enclosure 338. In another embodiment, sensor body 302 and electronics enclosure 338 can be further secured to another via an adhesive placed between flange 340 and lip 342. In still another embodiment, a compression fitting between flange 340 and lip 342 could be utilized to join sensor body 302 with electronics enclosure 338. In still yet another embodiment, one or more attachment means can be utilized to secure, or even further secure, sensor body 302 to electronics enclosure 338. Suitable attachment means include, but are not limited to, screws, rivets, bolts, etc. In another embodiment, electrical enclosure 338 is also designed as an electrical and thermal insulator. In this embodiment, electrical enclosure 338 prevents the beam current captured by MFC 310 from being conducted to the support stand via a clamp ring. Thus, in this embodiment all of the current in MFC 310 is channeled to MFC lead 318 and then onto a suitable computer system via suitable connecting wires. In addition, electrical enclosure 338 provides both a thermal and electrical barrier from the heat and backscatter electrons generated from the beam hitting the beam dump directly below sensor 300.

As can be seen from FIG. 2, the bottom portion of electronics enclosure 338 is fitted to a lower annular-shaped (or cylindrically-shaped) clamp ring body 344 and lower clamp ring 346. In one embodiment, clamp ring body 344 and lower clamp ring 346 are operatively connected and form an integrated bottom portion of sensor 300. In one embodiment, clamp ring body 344 and lower clamp ring 346 are operatively connected to one another via any suitable attachment means. Suitable attachment means include welding, compression fitting, adhesives, etc. In another embodiment, alternatively, or in addition to, the above mentioned attachment means for attaching clamp ring body 344 to lower clamp ring 346 comprises one or more screws (not pictured) that are designed to fit into one or more screw recesses 348 and screw into one or more corresponding threaded inserts 350 located in the bottom surface of electronics enclosure 338.

Regarding the materials from which the various components of beam imaging and/or profiling sensor 300 are formed from, such materials are not critical so long as the materials can withstand the energy levels to which they are exposed. As noted above, the material utilized to form MFC 310 needs to be electrically conductive as does the material utilized to form MFC lead 318. In one embodiment, both MFC 310 and MFC lead 318 are formed from the same material so that the electrical conductivity of these components of beam imaging and/or profiling sensor 300 are identical in nature. Alternatively, in another embodiment, it may be desirable to form MFC 310 and MFC lead 318 from different electrically conductive materials disclosed above.

In another embodiment, sensor body 302 is formed from a metal or metal alloy. Suitable metals, or metal alloys, include but are not limited to, corrosion resistant metals, or metal alloys, such as aluminum, titanium, stainless steel, martensitic stainless steel, duplex and/or super duplex stainless steel; high austenitic alloys, nickel-based alloys, and/or titanium alloys. In one embodiment, inner clamp ring 320 and outer clamp ring 322 are independently formed from any suitable metal, or metal alloy. Suitable metals, or metal alloys, include, but are not limited to, high-energy resistant metals, metal alloys, or combinations thereof. Suitable high-energy resistant metals, or metal alloys, include, but are not limited to, chrome-moly steel, tungsten, molybdenum, hafnium, or suitable alloys thereof. In one embodiment, inner slit disc 324 and outer slit disc 326 are independently formed from any suitable metal, metal alloy, or refractory material. Suitable metals, metal alloys, or refractory materials include, but are not limited to, tungsten, molybdenum, hafnium, or alloys thereof. In one embodiment, electronics enclosure 338 is formed from an electrically non-conductive material. Suitable electrically non-conductive materials include, but are not limited to, one or more organic-based or inorganic-based insulating compounds, glass-epoxy insulators (e.g., G-10), ceramic insulators, or any combination of two or more thereof. Suitable insulating compounds include, but are not limited to, phenolic resin-based insulating compounds, polytetrafluoroethylene-based insulating compounds (i.e., Teflon®-based insulating compounds, polyoxymethylene (a.k.a., acetal, polyacetal and/or polyformaldehyde such as Delrin®), alumina insulating compounds (e.g., high purity alumina or alumina silicate), silicon-based insulating compounds (e.g., silicon nitride), insulating glass compounds (e.g., machineable borosilicate glasses such as Macor®).

In one embodiment, the one or more threaded inserts 350 are each independently formed from a metal or metal alloy. Suitable metals, or metal alloys, include but are not limited to, corrosion resistant metal, or metal alloys, such as aluminum, titanium, stainless steel, martensitic stainless steel, duplex and/or super duplex stainless steel; high austenitic alloys, nickel-based alloys, and/or titanium alloys. In another embodiment, the one or more threaded inserts 350 are formed from the same material so as to facilitate the coupling of same as described above. In one instance the one or more threaded inserts 350 are formed from a suitable grade of stainless steel (e.g., 330 SS, 304 SS, and/or 316 SS). In one embodiment, clamp ring body 344 and lower clamp ring 346 are independently formed from a metal or metal alloy. Suitable metals, or metal alloys, include but are not limited to, corrosion resistant metal, or metal alloys, such as aluminum, titanium, stainless steel, martensitic stainless steel, duplex and/or super duplex stainless steel; high austenitic alloys, nickel-based alloys, and/or titanium alloys. In another embodiment, clamp ring body 344 and lower clamp ring 346 are formed from the same material so as to facilitate the coupling of same as described above. In one instance clamp ring body 344 and lower clamp ring 346 are formed from a suitable grade of stainless steel (e.g., 330 SS, 304 SS, and/or 316 SS).

Given the above, various advantages of the present invention versus that of the sensor of FIG. 1 will be discussed herein. It should be noted that the present invention is not limited to solely the following advantages. Rather, the following advantages are non-limiting in nature.

Slit Width and Profile:

The width and profile (i.e., thru thickness) of slit 332 are important to the operation and repeatability of sensor 300. The width of slit 332 determines how much beam energy is permitted to enter MFC 310 at a given time. The remainder of the beam energy is absorbed by the material from which inner slit disc 324 and outer slit disc 326 are formed from. The amount of energy entering MFC 310 in a given time period must be limited to prevent melting of and/or damage to MFC 310 because it is formed from a relatively low melting point conductive metal, or metal alloy material (e.g., copper, silver, gold, platinum, etc.). The maximum amount of energy that can satisfactorily be detected in MFC 310 is dependent upon the voltage, current level, and the focus position of the electron and/or ion beam.

In general, higher voltage/current beams that are more focused at the surface of sensor 300 require more limitations on the energy permitted to enter MFC 310 in a given time period to prevent damage to, or melting of, MFC 310. In addition to the width of slit 332, the thru thickness profile of slit 332 and/or the perpendicularity of slit 332 can introduce an error in the signal generated by MFC 310 because some of the energy that enters slit 332 is absorbed by the thru thickness surface of slit 332. It is therefore advantageous in one embodiment to have a slit geometry that has a relief angle on the backside of slit 332 to minimize the impingement of the beam on the thru thickness cross-section of slit 332.

By the nature of the design for the device of FIG. 1, the radial slits must be produced using a wire EDM process. Given this, the minimum slit width that can be reliably produced via such a process is 0.006 inches. In addition, if a relief angle is desired on the backside of the slit of the device of FIG. 1 (in order to reduce the amount of signal loss for the MFC of FIG. 1), then the minimum slit width that can readily be produced will increase in proportion to the relief angle.

In contrast, sensor 300 of the present invention utilizes a set of concentrically nesting inner and outer slit discs (324 and 326 respectively) formed from, for example, a refractory material to create the desired slit width. Given this, the slit width of the present invention is determined by the outer diameter of inner slit disc 324 and the inner diameter of outer slit disc 326, and the concentricity between inner slit disc 324 and outer slit disc 326. Using machining methods known to those of skill in the art, the combination of inner slit disc 324 and outer slit disc 326 can obtain slit widths of less than or equal to 0.010 inches, of less than or equal to 0.0075 inches, of less than or equal to 0.005, or even less than or equal to 0.002 inches. Here, as well as elsewhere in the specification and claims, different individual numerical limits can be combined to form non-stated numerical ranges. Such slit widths can be accurately and controllably produced due to the design of the present invention. Additionally, if a relief angle is applied to the backside of slit 332 there is no change in the minimum slit width that can be achieved with the design of the present invention.

Number of Slits:

As can be seen from FIG. 1, the design disclosed therein has multiple slits 216 at different angles that produce various cross sections of beam energy that must be mathematically reconstructed to provide both a two and three dimensional model of the beam. Given this, the more cross-sectional angles there are (i.e., the greater number of slits 216), the more accurate the reconstruction model. Given this, the sensor design of FIG. 1 has significant limitations regarding the number of slits that can be used. The first limitation is the physical stability of disk 201 to maintain the desired slit width when under the high thermal load as a result of profiling a beam. Slits 216 spaced too close together will result in insufficient stiffness for the ligaments between the slits and will result in variations in the slit width as a result of the mechanical forces generated by the transient thermal load to the sensor during profiling.

The second limitation of the sensor of FIG. 1 is based upon the geometry of the beam being profiled. At the point where the beam is being translated across the sensor of FIG. 1 the distance between adjacent slits must be at least equal to the diameter of the beam. Otherwise, the data signal from MFC of the sensor of FIG. 1 will be inaccurate as beam energy is entering the MFC from two adjacent slits at the same time. Since there is a need in the industry to profile both highly focused (i.e., beams having small beam diameters) and defocused (i.e., beams having large beam diameters), the sensor of FIG. 1 is, at a minimum, less capable for defocused beam conditions. It is also not practical to increase the diameter of the sensor of FIG. 1 so as to provide more distance between adjacent radial slits for reasons explained below.

In contrast to the sensor of FIG. 1, the sensors of the present invention utilize a single slit 332 whose dimensions are maintained by the robustness of the concentrically nesting inner and outer slit discs (324 and 326, respectively). The approach for probing using a sensor according to the present invention involves translating the beam across and perpendicular to slit 332 from the inner diameter to the outer diameter of the sensor. Data is collected for a given beam position and then indexed to the next desired angle position. With this method, the number of angles for which the beam cross section is analyzed can be as coarse or fine (on the order of a degree) as desired by a user. In addition, due to the nature of the sensor design of the present invention there is no risk of errant data as a result of the beam energy entering multiple slits as is the case with the sensor of FIG. 1.

Beam Deflection Angle:

The sensor of FIG. 1 requires the beam to be translated across slits 216 using a circular beam deflection path as defined by the welding process where the origin of the beam is coincident with the center of the sensor of FIG. 1. The radius for this deflected beam is highly dependent upon the distance from the electron beam gun to the sensor and is limited by the physical and electrical characteristics of the electron gun. Many companies have production welding procedures where the gun is less than six inches from the work surface. Given this, the make and manufacturer of the electron beam gun will determine the maximum deflection distance achievable at these gun-to-work distances, but it is typically on the order of one inch. Thus, the translation method across slits 216 required by the sensor of FIG. 1 results in the beam not being perpendicular to one or more of slits 216 because the deflection angle required to create the circular beam path. This non-perpendicularity of the beam results in an artificial error for the measured beam diameter, shape and power distribution.

On the other hand, a sensor in accordance with the present invention utilizes a single slit whose dimensions are maintained by the robustness of the concentrically nesting inner and outer slit discs (324 and 326, respectively). The approach for probing using a sensor according to the present invention involves translating the beam across and perpendicular to slit 332 from the inner diameter to the outer diameter of the sensor. Data is collected for a given beam position and then indexed to the next desired angle position. The nature of the beam translation for the sensor of the present invention places the beam free-fall position (i.e., undeflected) directly over slit 332. This method produces a more accurate measurement of the beam because it is perpendicular to the surface of the slit in both the X and Y planes. Regardless of the method of translation for the beam (the sensor of FIG. 1 or the present invention), the beam is subject to a magnetic field to generate the translation path. The higher the deflection angle and the higher the rate of beam translation will require a higher magnetic field to produce the desired path. It is well known that high magnetic fields can distort the shape of the electron beam. Thus another advantage of the approach of the present invention is that with the beam free-fall position positioned directly over the slit the magnitude of the magnetic field for translation of the beam is minimized and is zero when the beam is perpendicular to the slit. This approach provides the most accurate measurement of the beam characteristics.

Sensor Thermal Load:

The sensor of FIG. 1 claims to be capable of measuring high energy beams on the order of 10 s of kilowatts. This capability is far over-stated due to the design and required profiling method using the sensor of FIG. 1. The process of probing with the sensor of FIG. 1 results in all of the beam energy being absorbed through the start/stop block, central hole, and the disk itself. It is well known by those of skill in the art that focused electron beam settings greater than 20 kW can impart a tremendous thermal load (even to the point of vaporization) to the substrate. The air cooled version of the sensor of FIG. 1 has been shown to have a thermal limitation of approximately 5 kW. A water-cooled version of the sensor of FIG. 1 will increase the capabilities of the sensor, but its maximum capacity will be far below the maximum power output of today's electron beam machines.

In contrast, the design of the sensor of the present invention utilizes a hollow inner diameter for the sensor that permits the beam to pass by the sensor and into a separate beam dump device. The act of profiling involves momentarily translating the beam across a circular or polygonal circumferential slit, then returning the beam to the center of the sensor where it is again captured by the beam dump. This approach to profiling imparts a much lower energy and thermal load to the sensor of the present invention. Thus, the sensor of the present invention is capable of profiling beams at much higher power levels than the sensor of FIG. 1. For example, the sensor designs of the present invention can profile beams having power levels in excess of 30 kW. Since there are many production electron beam welding procedures at beam energy levels in excess of 10 kW, the sensor of the present invention permits a user to profile a beam at actual production welding parameters. In contrast, the sensor of FIG. 1 requires a user to extrapolate the results from much lower beam power settings. It is well known by those of skill in the art that extrapolation of the beam characteristics is highly inaccurate.

Faraday Cup Design:

The design of the sensor of FIG. 1 requires the use of a second disk (i.e., conduction disk) that is used to block secondary ions/electrons from leaving the MFC of the sensor of FIG. 1. The conduction disk must have radial slits through thickness and aligned with the radial slits in the refractory disk. By the nature of machining and alignment tolerances the need for two aligned radial slit disks introduces an additional error in the measured signal. Some portion of the beam energy that passes through the first radial slits 216 in the refractory disk may not be aligned with the radial slits 212 in the conducting disk and therefore do not get contained within the MFC.

The sensor design of the present invention utilizes a MFC 310 that eliminates the need for a conducting disk to control secondary ions/electrons. The design of MFC 310 is such that the secondary ions/electrons are reflected into the internal cavity of MFC 310 and therefore remain contained within MFC 310. Thus, the approach and design of the present invention reduces error in the measured signal.

Figure 4:
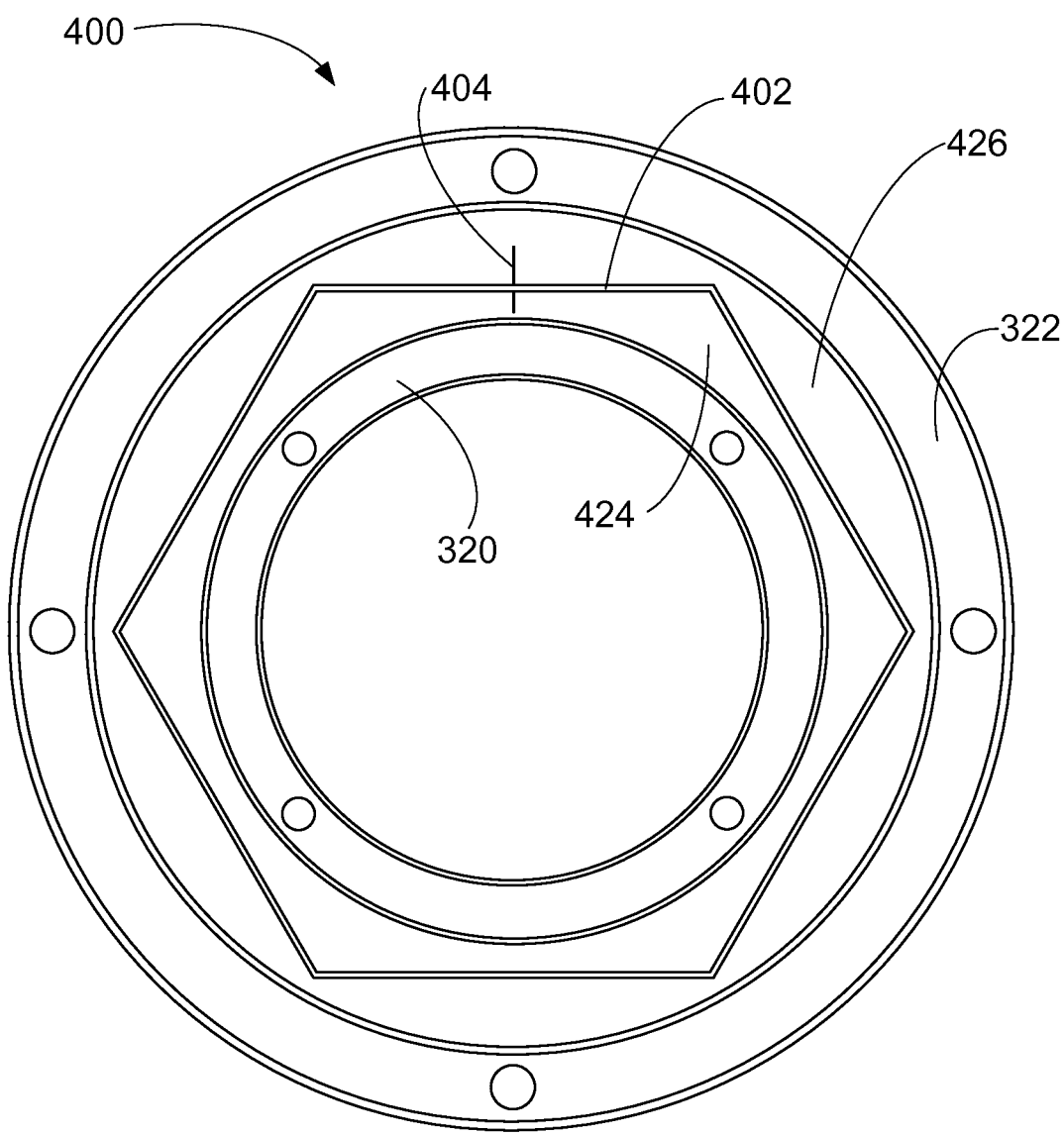
FIG. 4 is a partial top-down illustration of a beam imaging sensor according to another embodiment of the present invention.
Figure 5:
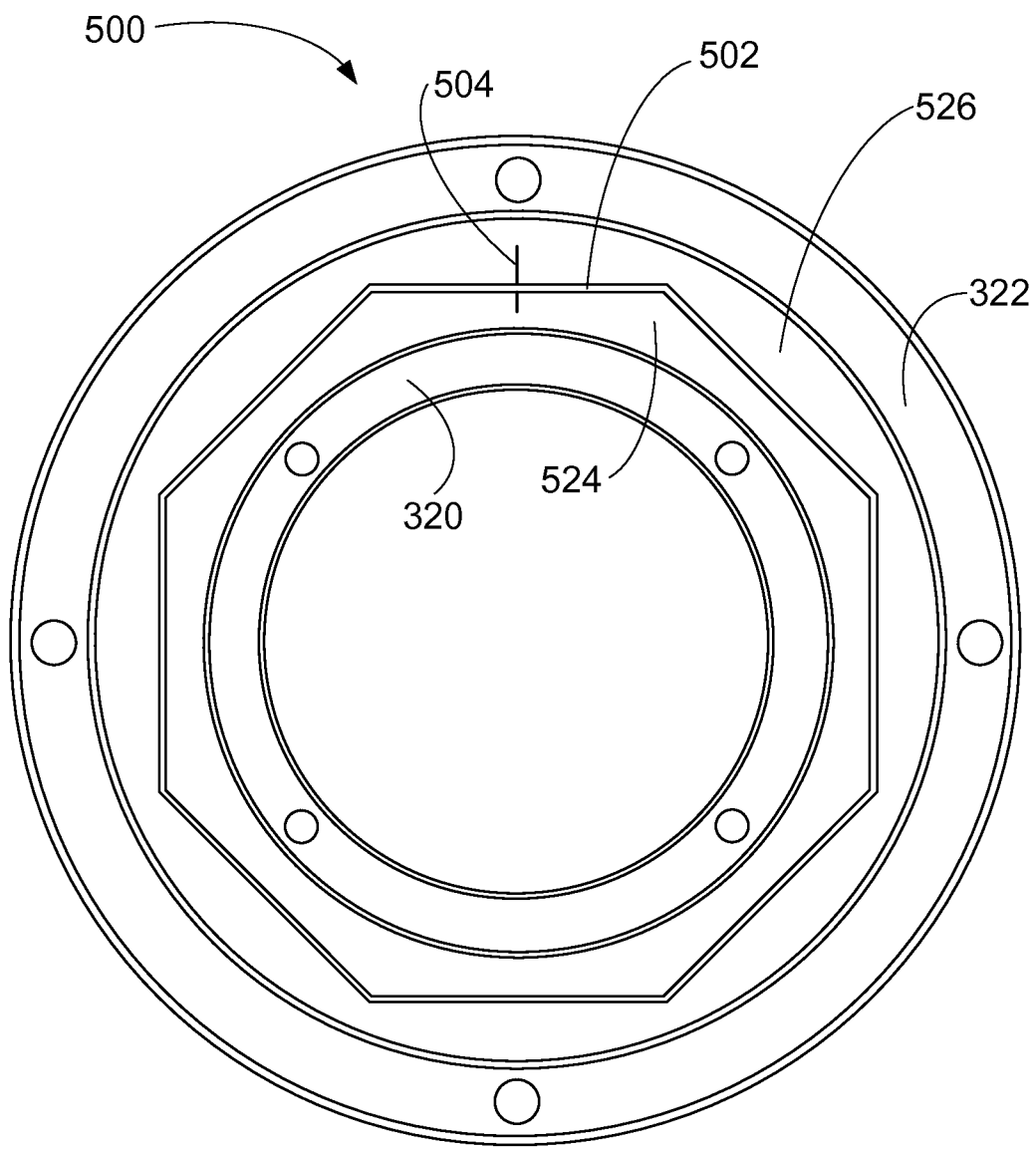
FIG. 5 is a partial top-down illustration of a beam imaging sensor according to still another embodiment of the present invention.

Turning to FIGS. 4 and 5, these Figures illustrate alternative embodiments of the present invention where slit 332 is polygonal in shape. Regarding sensor 400 of FIG. 4 and sensor 500 of FIG. 5, these sensors are identical in design and make-up to sensor 300 described above except with regard to the geometric shape of their respective slits formed from their respective nesting inner and outer slit discs (424/426 and 524/526, respectively). FIG. 4 illustrates a hexagon-shaped slit 402, whereas FIG. 5 illustrates an octagon-shaped slit 502. It should be noted that the advantages discussed above with regard to sensor 300 apply to sensors 400 and 500 as well. In additional to various other polygonal-shaped slits (not just those pictured in FIGS. 4 and 5), the sensors of the present invention can have slits profiles, or geometries, that include flats tangent to the rings and at several different angles around the circumference. Thus, any suitable polygonal-shaped slit path can be so produced. In one embodiment, if such slit flats are aligned with the desired angle for profiling, then the beam would be measured by a slit having a straight line profile. Additionally, as can be seen in both FIGS. 4 and 5, the present invention can in one embodiment possess alignment aids 404 and 504, respectively, which are in part formed on each of inner slit discs 424 and 524 and in part on each of outer slit discs 426 and 526. As can be seen in FIGS. 4 and 5, alignment aids 404 and 504 are illustrated as a two part straight line alignment mark. However, this feature of the present invention is not limited thereto. Rather, any suitable indicia could be utilized to provide an alignment aid to permit a user to more accurately, or properly, align the inner slit disc with the outer slit disc of a beam imaging sensor according to the present invention. For example, the straight line mark 404 and/or 504 could be replaced with a pair of indicia with one indicia from each pair being formed on each of the inner slit disc and the outer slit disc directly across from one another. Suitable indicia include, but are not limited to, any suitable combination of two or more dots, two or more circles, two or more Xs, two or more like or different letters, two or more like or different numbers, two or more arrows, etc.

In still another embodiment, inner and outer slit discs (324 and 326, respectively) can be replaced with arc segments. In still another embodiment, inner and outer slit discs (324 and 326, respectively) can be formed to be non-circular. In still another embodiment, the width of slit 332, 402 and/or 502 can be varied along the slit path by adding lobes to the profile of inner and outer slit discs (324 and 326, respectively) or arc segments. Thus one non-limiting embodiment is where at twelve o'clock the slit width is, for example, 0.002 inches, at three o'clock the slit width is changed as desired and, for example, could be set at 0.006 inches. Additional slit width and profile changes could be made along the remainder of the slit path as desired. In one embodiment, when the width of slit 332 is varied along the slit path, or comprises one or more lobes, the inner slit disc and the outer slit disc of any of the embodiments of the present invention can further possess one or more alignment aids, or sets of alignment aids, similar to those describe above with regard to FIGS. 4 and 5. Again, any suitable indicia could be utilized to provide an alignment aid to permit a user to more accurately, or properly, align an inner slit disc with an outer slit disc of a beam imaging sensor according to the present invention. Suitable indicia include, but are not limited to, any suitable combination of two or more dots, two or more circles, two or more Xs, two or more like or different letters, two or more like or different numbers, two or more arrows, etc.

Figure 6:
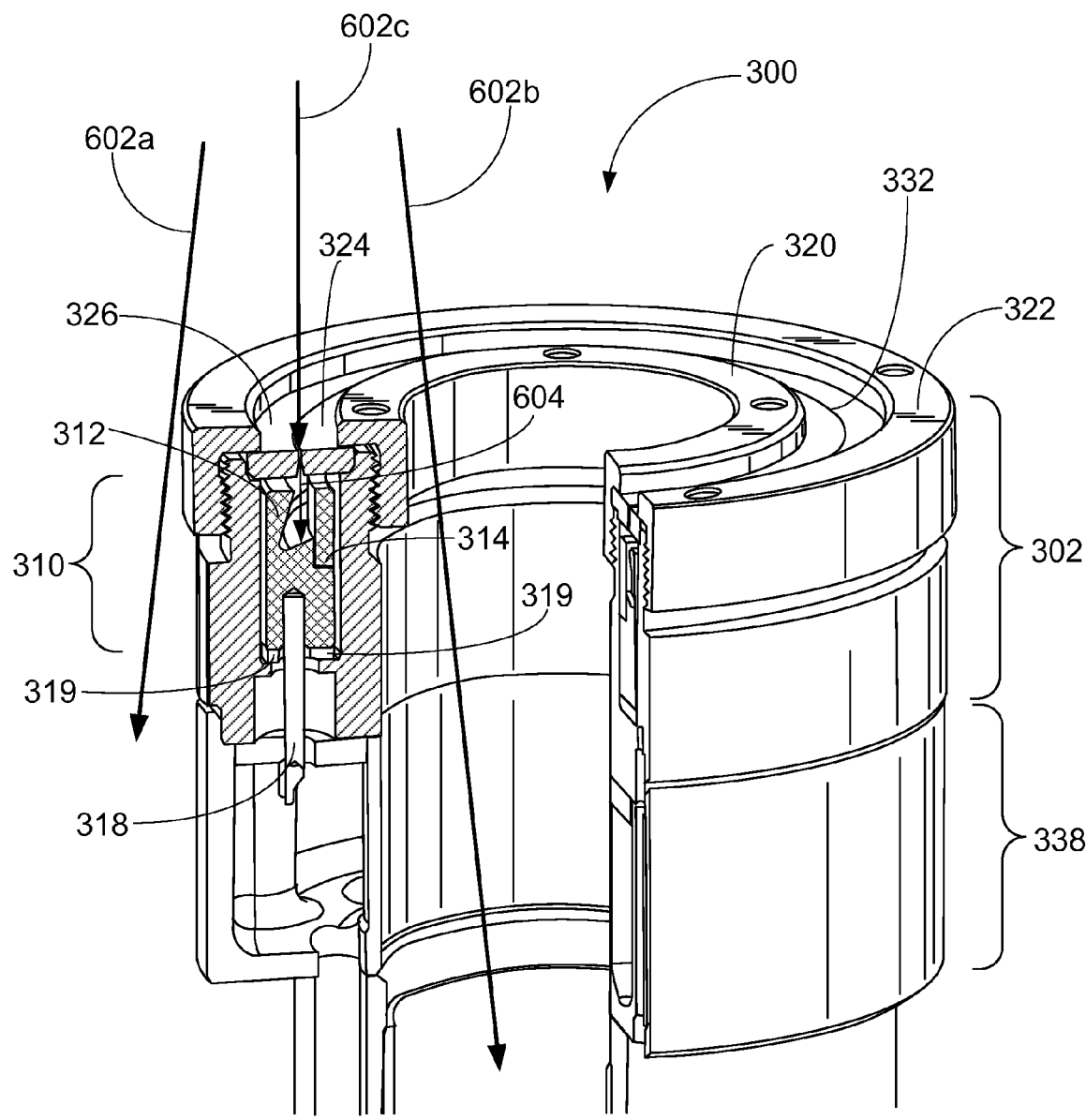
FIG. 6 is a close up illustration of a beam imaging sensor of the present invention containing a detailed illustration of the beam path through the sensor.
Figure 7:
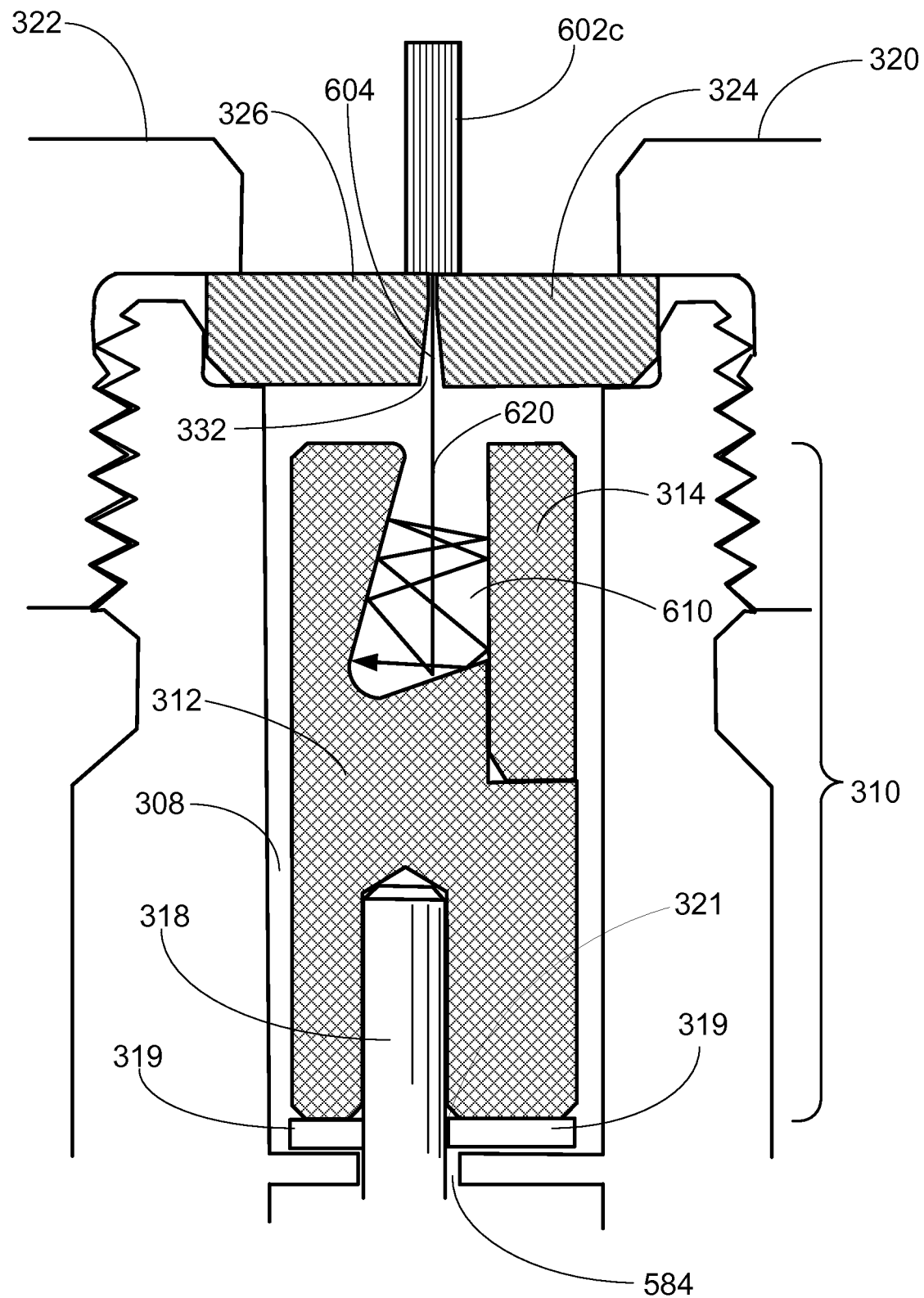
FIG. 7 is a close-up illustration of the MFC portion of a beam imaging sensor according to the present invention.

Turning to FIGS. 6 and 7, FIG. 6 illustrates the path of an electron beam through a sensor according to the present invention. As is illustrated in FIG. 6, three different portions of an electron, or ion, beam are illustrated via arrows 602a, 602b and 602c. As can be seen from FIG. 6, a portion of an electron, or ion, beam upon "hitting" sensor 300 passes on the outside side of sensor 300 (represented by arrow 602a), whereas another portion passes through the inside cylindrically-shaped portion of sensor 302 (represented by arrow 602b). A third portion of the electron, or ion, beam "hits" sensor 300 at slit 332 in a substantially perpendicular orientation (represented by arrow 602c). At least a portion of the beam 602c that impacts sensor 300 at slit 332 is able to pass through slit 332 and into MFC 310 where this portion of beam that pass through slit 332 is represented by arrow 604 in FIG. 6. Due to the passage of a portion of the electron, or ion, beam 604 through slit 332 into MFC 310 a current is able to be generated due to the beam being reflected around the internal space 610 (see FIG. 7) of MFC 310 in one exemplary pattern represented by arrow 620 (see FIG. 7). Turning to FIG. 7, FIG. 7 is a close-up cross-sectional slice of the upper left hand portion of FIG. 2. Given this, FIG. 7 illustrates one possible beam path 620 in MFC 310 when the portion 604 of the electron and/or ion beam 602c passes through slit 332. Thus, as can be seen from FIG. 7, the portion of the electron, or ion, beam that passes through slit 332 and into MFC 310 is reflected off the internal surfaces of MFC 310 in one exemplary pattern 620, thereby generating a current and/or signal that is picked-up and/or transmitted by MFC 310 to MFC lead 318 and onto a suitable computer to be analyzed as detailed above.

Figure 8:
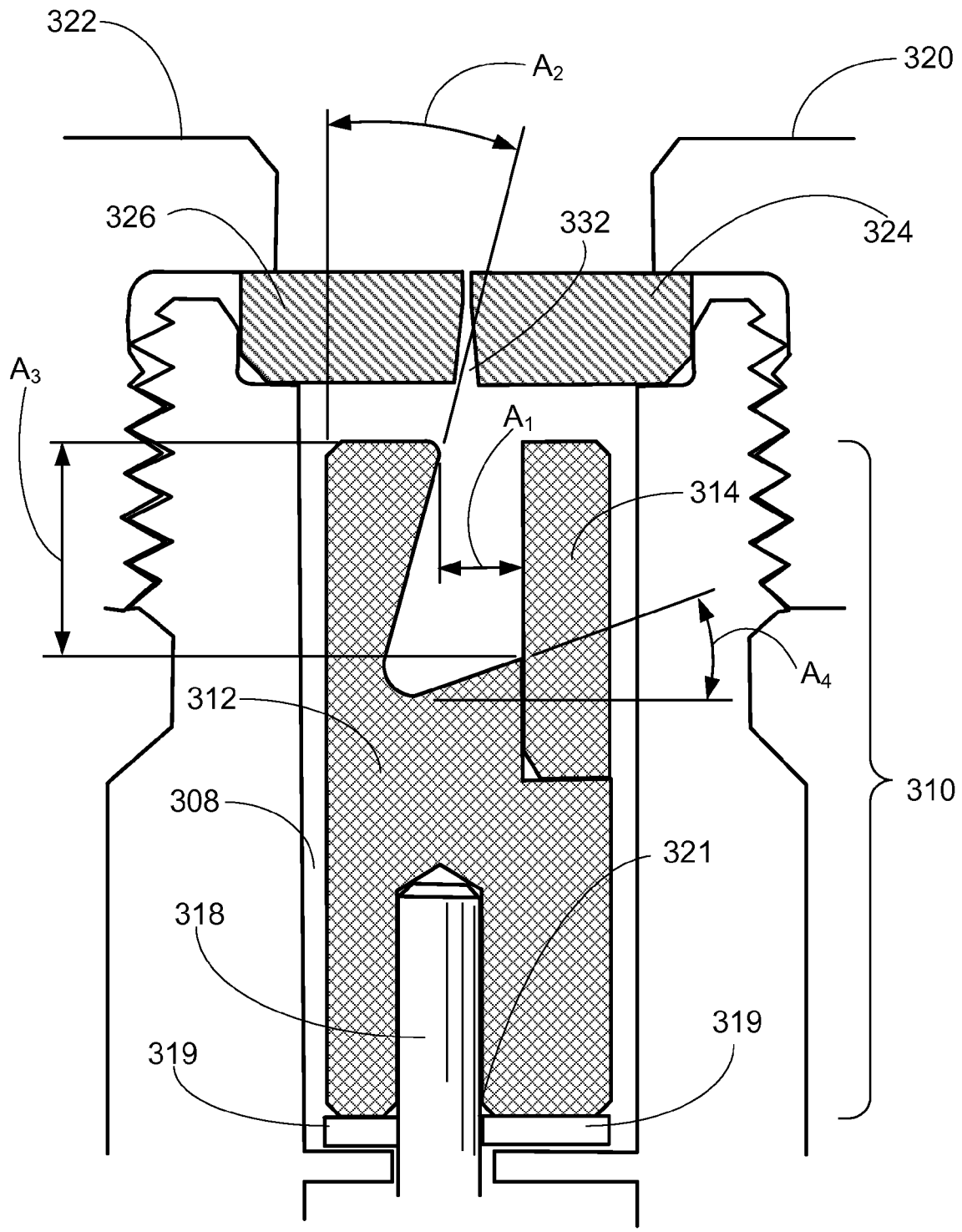
FIG. 8 is a close-up illustration of the MFC portion of a beam imaging sensor illustrating one possible design layout for the MFC portion of a beam imaging sensor according to one embodiment of the present invention.

Turning to FIG. 8, FIG. 8 is a close-up illustration of the MFC portion of a beam imaging sensor illustrating one possible design layout for the MFC portion of a beam imaging sensor according to one embodiment of the present invention. As illustrated in FIG. 8, MFC 310 of the present invention should be designed to minimize, reduce and/or eliminate the number, or amount, of electrons or ions that escape from MFC 310 after entry thereto. In other words, once portion 604 of beam 602c enters into MFC 310 and begins to undergo reflection therein in, for example, the path represented by arrow 620 (see FIG. 7), the amount of electrons and/or ions that escape from MFC 310 should be reduced to as few as possible, or even eliminated altogether. One manner by which such a goal can be accomplished is by controlling the internal geometry of MFC 310. For example, in one embodiment MFC 310 is designed taking into consideration four geometric factors. The four factors are represented in FIG. 8 by the variables $A_1$, $A_2$, $A_3$ and $A_4$ in FIG. 8. As can be seen in FIGS. 2, 3, 6, 7 and 8, MFC 310 is formed by two or more pieces 312 and 314 as discussed above and contains therein an internal space 610 (see FIG. 7) that is formed from the combination of one substantially straight internal sidewall, one sloped internal sidewall, a sloped (or canted) bottom, and an open top designed to permit a portion 604 of beam 602c to enter into space 610 of MFC 310. In one embodiment, space 610 is similar in shape to the side profile of a human nose. Additionally, the sloped internal sidewall of space 610 is, in one embodiment, formed in one integral piece with the sloped bottom of space 610 and together form a rounded corner at the lower end of the sloped bottom of pace 610 (see FIGS. 2, 3, 6, 7 and 8). However, it should be noted that the present invention is not limited to any one profile for space 610 and/or any one manner in which space 610 is formed.

After entry into space 610 of MFC 310, beam portion 604 bounces around, or is reflected, within space 610 in any number of patterns including the exemplary one illustrated by path 620 in FIG. 7. Given this, by selecting various dimensions and/or angles of the three sides of space 610 in MFC 310 one can optimize the amount of electrons, or ions, that are permitted to enter space 610 as well as the amount of electrons, or ions, that are "lost" to backscatter by escaping space 610 of MFC 310.

Given the considerations and factors discussed above, $A_1$ is in one embodiment set to be slightly larger than the width of slit 332 in order to facilitate capture, or transmission, of substantially all, or completely all, of the electrons, or ions, that pass through slit 332 and are denoted herein as beam portion 604. Thus, given the fact that slit 332 can vary in width, there is no set dimensional range for $A_1$. In other words, $A_1$ can be selected to be any width so long as the width of $A_1$ is greater than the width of slit 332. In one non-limiting embodiment, slit 332 is 0.05 inches in width or less (i.e., about 1.27 mm or less) and $A_1$ is about 0.1 inches in length (i.e., about 2.54 mm). Again, as is stated above, the dimensions for slit 332 as well as $A_1$ are not to be construed as limited to any of the exemplary dimensions discussed herein. Turning to dimension $A_2$, $A_2$ represents the amount of slope in the one internal sidewall of space 610. In one embodiment, the sloped internal sidewall of space 610 has a positive slope and has an angle, denoted $A_2$ in FIG. 8, of between about 5 degrees and about 25 degrees. In another embodiment, the angle measured, or denoted by, $A_2$ is in the range of about 7.5 degrees to about 20 degrees, or from about 10 degrees to about 17.5 degrees, or even about 15 degrees. Here, as well as elsewhere in the specification and claims, different individual numerical limits can be combined to form non-stated numerical ranges.

Turning to dimension $A_3$, $A_3$ represents the minimum depth of space 610 as can be seen in FIG. 8. Given this, in one embodiment there is no set dimensional range for $A_3$. In another embodiment, $A_3$ is in the range of about 0.1 inches (i.e., about 2.54 mm) to about 0.5 inches (i.e., about 12.7 mm), or from about 0.2 inches (i.e., about 5.08 mm) to about 0.4 inches (i.e., about 10.16 mm), or even about 0.25 inches (i.e., about 6.35 mm). Here, as well as elsewhere in the specification and claims, different individual numerical limits can be combined to form non-stated numerical ranges.

Turning to dimension $A_4$, $A_4$ represents the amount of slope in the sloped (or canted) bottom 610. In one embodiment, the slope (or canted) bottom of space 610 has a positive slope and has an angle, denoted $A_4$ in FIG. 8, of between about 5 degrees and about 35 degrees. In another embodiment, the angle measured, or denoted by, $A_4$ is in the range of about 7.5 degrees to about 30 degrees, or from about 10 degrees to about 27.5 degrees, or even about 25 degrees. Here, as well as elsewhere in the specification and claims, different individual numerical limits can be combined to form non-stated numerical ranges.

It should be noted that the shape and/or composition of space 610 is not to be limited to just those embodiments discussed above. Rather, space 610 could be formed to have more than three walls so long as the top of space 610 is open to permit entry of at least a portion of an electron, or ion, beam. For example, any one, or both, of the internals sidewalls of space 610 could be sloped or faceted with two or more facets so long as space 610 is designed to retain as many as possible of the electrons, or ions, that enter therein. Given this, space 610 of MFC 310 is not limited to any one geometrical shape, or layout, so long as space 610 is formed to optimize the amount of electrons, or ions, that are permitted to enter space 610 and remain therein without losing, in one embodiment, a significant amount, or even no, electrons, or ions, to backscatter by escaping space 610 of MFC 310.

Turing to FIGS. 9 through 12, these Figures illustrate various alternative embodiments for securing and/or attaching various portions of the beam sensors of the present invention to one another. Specifically, FIG. 9 is a close-up illustration of a side portion of beam sensor 300 that illustrates an alternative manner to attach and/or secure outer clamp ring 322 to sensor body 302. As illustrated in FIGS. 9 and 11, the threaded portions of outer clamp ring 322 and the outer threaded surface of sensor body 302 (see FIGS. 2, 3, 6 and 7) have been eliminated. Instead of utilizing a threaded arrangement to secure outer clamp ring 322 to sensor body 302 a series of two or more, three or more, or even four or more securing arm clamps 570 are designed to operatively engage a securing means (e.g., a tooth 572) that is formed along the circumferential outer surface of outer clamp ring 322. Additionally, each securing arm clamp 570 has a corresponding tooth 574 that is designed to engaged and secure in combination with tooth 572 outer clamp ring 322 to sensor body 302. As can be seen in FIGS. 9 and 11, each securing arm clamp 570 is rotatably attached to sensor body 302 via a suitable attachment means including, but limited to, an eccentric screw, a screw, a rivet, a pin, or any other attachment means 576 that permits clamp 570 to be operatively rotatable (see, e.g., the double-headed arrow 578 in FIG. 9). Regarding the ability of clamp 570 to be rotatably engaged and/or disengaged, this is accomplished by corresponding circumferential notches 580 and 582 that are respectively formed on the outer surface of both sensor body 302 and outer clamp ring 322 (see FIG. 9) that permit the desired number of clamps 570 to be rotatably engaged, or unengaged, by rotating each respective clamp in an arc motion (see, e.g., the double-headed arrow 578 in FIG. 9). Regarding reference numeral 584, this reference refers to an internal opening in sensor body 302 that permits MFC lead 318 to pass through sensor body 302 and eventually make electrical contact with MFC 310 (see FIGS. 2 and 11 as well as additional details above).

Turning to the embodiment of FIG. 10, FIG. 10 illustrates an alternative embodiment to the clamps 570 of FIG. 9. As can be seen from FIG. 10, each one or more clamps 570 from FIG. 9 may be replaced with a clamp 670. As can be seen in FIG. 10, clamp 670 contains therein a wire cut flexure portion 675 to permit clamp 670 to maintain, or possess, spring compliance if so desired and/or needed. Besides this wire cut flexure portion (or feature) 675, the remainder of this embodiment is similar to that the embodiment of FIG. 9. Accordingly, for the sake of brevity a detailed description of the additional features and the workings of clamp 670 is omitted herein.

It should be noted that in still another embodiment of the present invention any desired numerical combination of one or more of clamp 570 can be combined with one or more of clamp 670 to secure outer clamp ring 322 to sensor body 302. Given this, the present invention encompasses: (i) utilizing a series of two or more, three or more, or even four or more securing arm clamps 570; (ii) utilizing a series of two or more, three or more, or even four or more securing arm clamps 670; and/or (iii) utilizing any desired combination of two or more, three or more, or even four or more securing arm clamps 570 and 670 to secure outer clamp ring 322 to sensor body 302.

Figure 12:
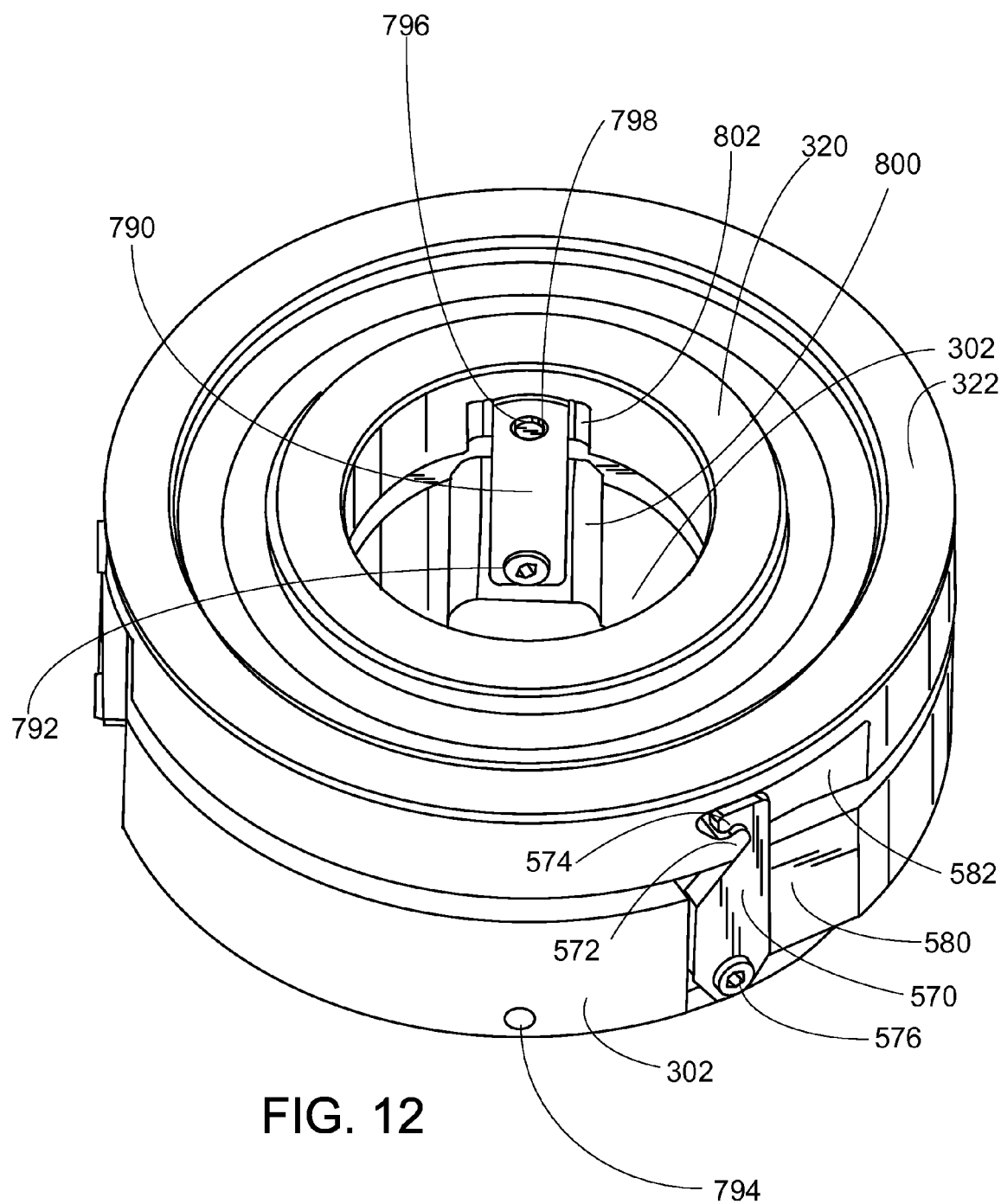
FIG. 12 is a close-up illustration of a portion of beam sensor 300 illustrating an alternative attachment means for securing inner clamp ring 320 to sensor body 302.

Turning to FIG. 12, FIG. 12 illustrates an alternative embodiment for securing inner clamp ring 320 to sensor body 302. As is illustrated in FIGS. 2, 3, 6 and 7, inner clamp ring 320 is secured to sensor body 302 via threaded portions that are formed on the corresponding inner circumferential surface at the top end of sensor body 302 and the outer circumferential surface of inner clamp ring 320. In the embodiment illustrated in FIG. 12, inner clamp ring 320 is secured to the inner circumferential portion of sensor body 302 via two or more, three or more, or even four or more clamp arms 790. As can be seen from FIG. 12, clamp arm 790 is secured to the inner surface of sensor body 302 via any suitable attachment means including, but limited to, an eccentric screw, a screw a rivet, a pin, or any other attachment means 792 that permits clamp arm 790 to be operatively secure inner clamp ring 320 to sensor body 302. Regarding how attachment means 792 is securely tightened; one such manner is illustrated in FIG. 12 where a thru hole, or opening, 794 is formed from the external circumferential surface of sensor body 302 thru the complete width of sensor body 302 to permit the corresponding insertion and external tightening of attachment means 792. In one embodiment, the use of an eccentric screw for attachment means 792 makes this thru hole, or opening, 794 embodiment for securing clamp arm 790 particularly useful. Alternatively, attachment means 792 could be securely tightened via a suitable designed tool that would permit one to tighten the attachment means 792 from the inside surface of sensor body 302.

Regarding the manner in which clamp arm 790 engages the desired lower portion of inner clamp ring 320, in one embodiment a suitably sized dowel pin 796 can be formed in, or secured to, two or more, or three or more, or even four or more places on the lower inner lip portion of inner clamp ring 320. In this embodiment, a corresponding opening, or hole, 798 is formed at the top end of clamp arm 790 to permit at least a portion of dowel pin 796 to pass there through. Given the above and as can be seen from FIG. 12, a lower portion of clamp arm 790 resides in notch 800 formed in the inner circumferential surface of sensor body 302, while a top portion of clamp arm 790 resides in notch 802 formed in the inner circumferential surface of inner clamp ring 320.

As would be apparent to those of skill in the art upon reading and understanding the disclosure of the present invention, clamp arm 790 is first secured to inner clamp ring 320 via dowel pin 796 (or some other suitable equivalence thereof). Next, attachment means 792, which in this embodiment is an eccentric screw, is then utilized to secure clamp arm 790 to sensor body 302 via thru hole 794 so as to substantially, or even totally, restrict the movement of clamp arm 790. In light of the use of two or more, or three or more, or even four or more clamp arms 790, inner clamp ring 320 can be securely mounted to, or fastened to, sensor body 302. Regarding the attachment of outer clamp ring 322 to sensor body 302, in one embodiment this is accomplished by rotatably securing clamps 570 to each clamp's respective tooth 572 and then further tightening attachment means 576 so as to secure outer clamp ring 322 to sensor body 302.

In another embodiment of the present invention, the beam imaging sensor disclosed herein could be formed so as to have any desired shape. Such shapes include not only the substantially circular shape of FIGS. 2 through 12, but elliptical, polygonal, arced, etc. In the case where the beam imaging sensor of the present invention has a shape other than circular, at least sensor body 302 is formed to have, for example, a polygonal shape and/or an elliptical shape. In this case the sensor of FIG. 3 may be elliptical, or polygonal in shape rather than the circular shape shown therein.

Figure 13:
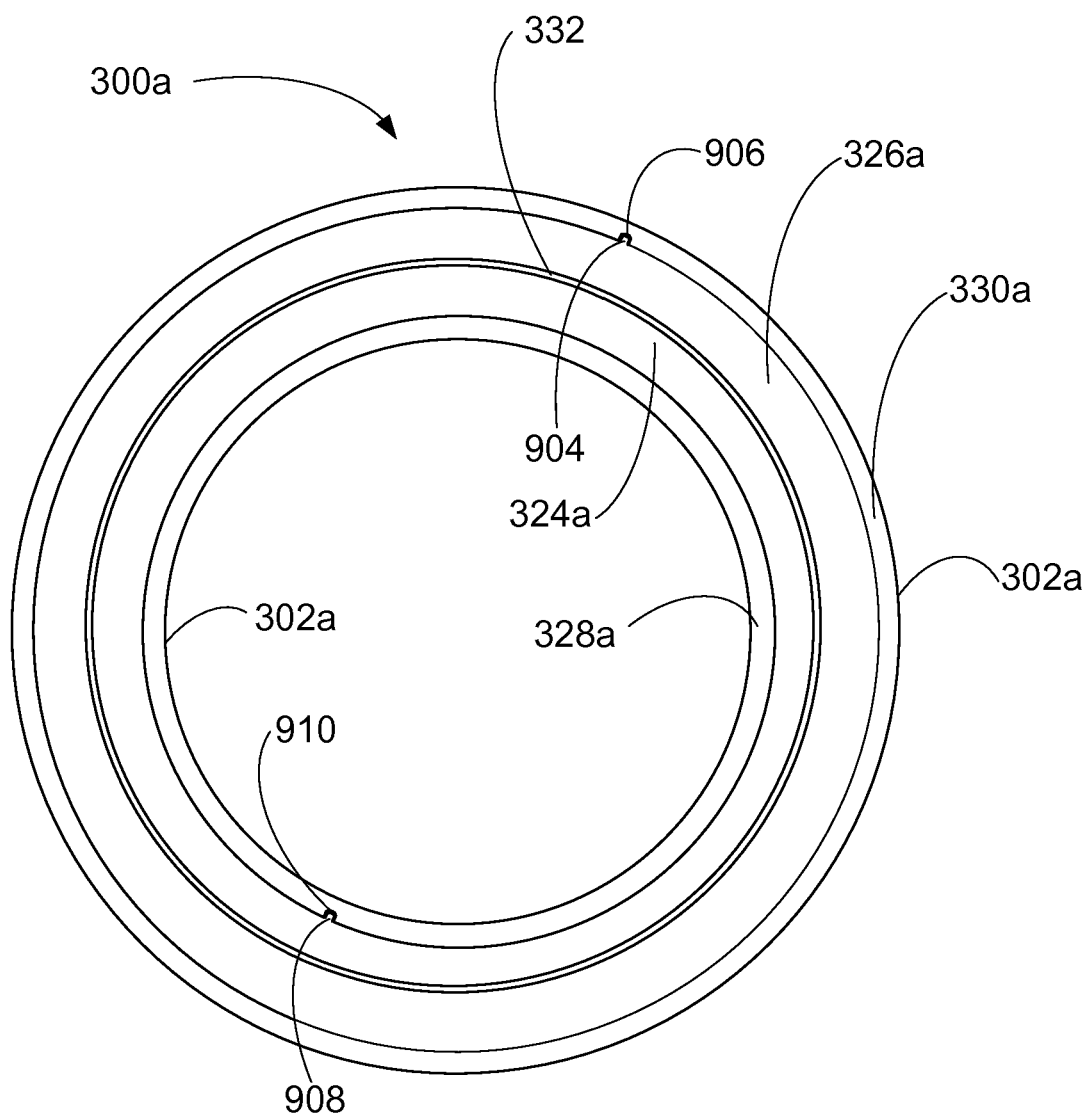
FIG. 13 is a partial top-down illustration of a portion of a beam imaging sensor according to still another embodiment of the present invention.

Turning to FIG. 13, FIG. 13 is a partial top-down illustration of the top portion of a beam imaging sensor 300a according to still another embodiment of the present invention. In the embodiment of FIG. 13 nesting inner slit disc 324 and outer slit disc 326 have been replaced with nesting inner slit disc 324a and outer slit disc 326a. Discs 324a and 326a differ from discs 324 and 326 in that discs 324a and 326a have alignment protrusions formed thereon. Specifically, outer slit disc 326a has a protrusion 904 formed thereon which fits into a corresponding notch, or indentation, 906 formed in outer ledge 330a of sensor body 302a such that outer slit disc 326a can only be seated into outer ledge 330a in one orientation. Although outer slit disc 326a and outer ledge 330a are shown with only one protrusion/notch combination, any number of protrusion/notch combinations can be utilized on outer slit disc 326a and outer ledge 330a so long as there is only one orientation in which to seat outer slit disc 326a into outer ledge 330a of sensor body 302a. Regarding inner slit disc 324a, inner slit disc 324a has a protrusion 908 formed thereon which fits into a corresponding notch, or indentation, 910 formed in inner ledge 328a of sensor body 302a such that inner slit disc 324a can only be seated into inner ledge 328a in one orientation. Although inner slit disc 324a and inner ledge 328a are shown with only one protrusion/notch combination, any number of protrusion/notch combinations can be utilized on inner slit disc 324a and inner ledge 328a so long as there is only one orientation in which to seat inner slit disc 324a into inner ledge 328a of sensor body 302a. It should be noted that the remainder of beam imaging sensor 300a, although not illustrated, is identical in nature to beam imaging sensor 300 as described above.

Figure 14:
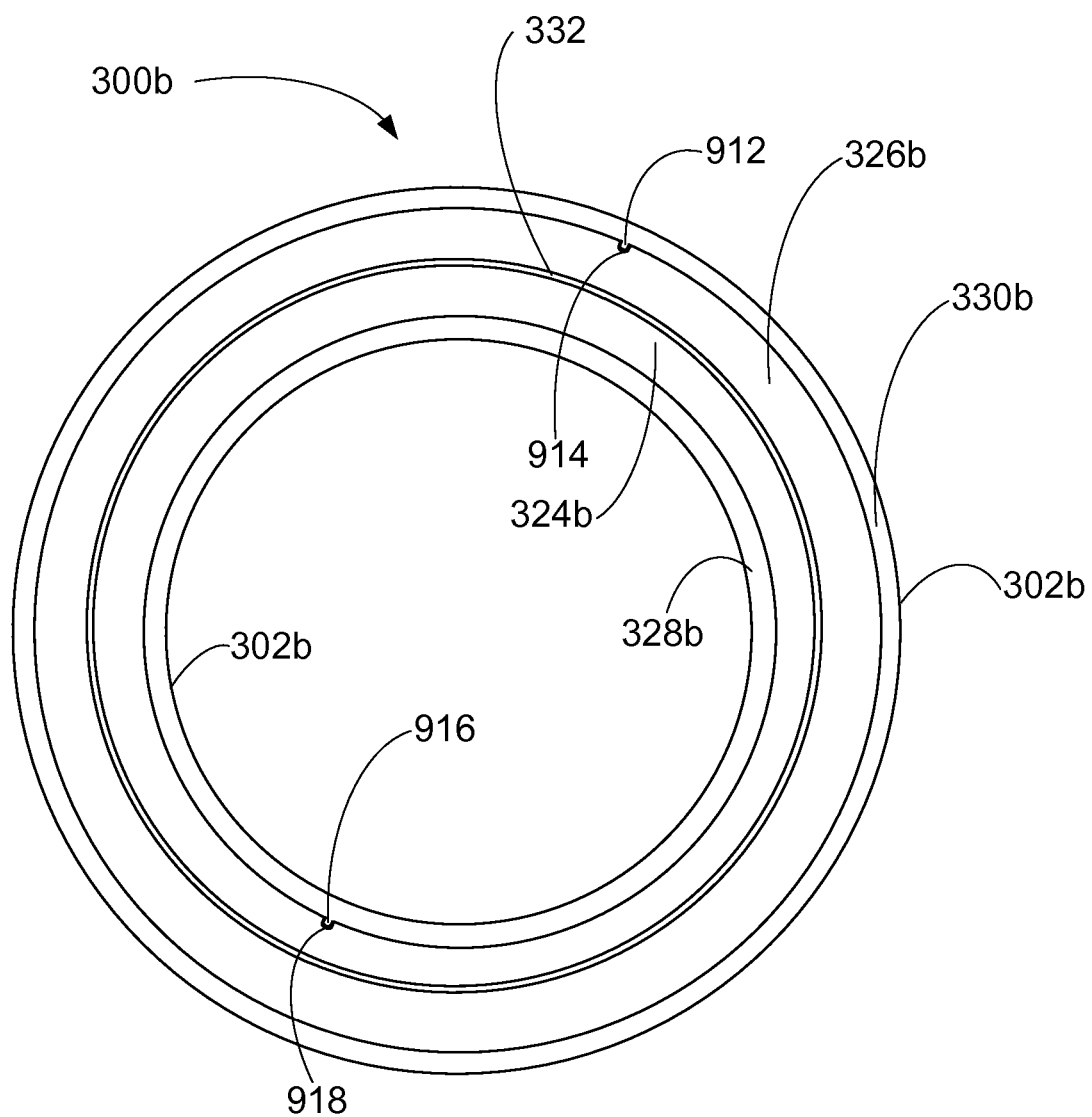
FIG. 14 is a partial top-down illustration of a portion of a beam imaging sensor according to still yet another embodiment of the present invention.

Turning to FIG. 14, FIG. 14 is a partial top-down illustration of the top portion of a beam imaging sensor 300b according to still another embodiment of the present invention. In the embodiment of FIG. 14 nesting inner slit disc 324 and outer slit disc 326 have been replaced with nesting inner slit disc 324b and outer slit disc 326b. Discs 324b and 326b differ from discs 324 and 326 in that discs 324b and 326b have alignment notches, or indentations, formed therein. Specifically, outer slit disc 326b has a notch, or indentation, 914 formed therein which receives a corresponding protrusion 912 formed on outer ledge 330b of sensor body 302b such that outer slit disc 326b can only be seated into outer ledge 330b in one orientation. Although outer slit disc 326b and outer ledge 330b are shown with only one protrusion/notch combination, any number of protrusion/notch combinations can be utilized on outer slit disc 326b and outer ledge 330b so long as there is only one orientation in which to seat outer slit disc 326b into outer ledge 330b of sensor body 302b. Regarding inner slit disc 324b, inner slit disc 324b has a notch, or indentation, 918 formed therein which receives a corresponding protrusion 916 formed on inner ledge 328b of sensor body 302b such that inner slit disc 324b can only be seated into inner ledge 328b in one orientation. Although inner slit disc 324b and inner ledge 328b are shown with only one protrusion/notch combination, any number of protrusion/notch combinations can be utilized on inner slit disc 324b and inner ledge 328b so long as there is only one orientation in which to seat inner slit disc 324b into inner ledge 328b of sensor body 302b. It should be noted that the remainder of beam imaging sensor 300b, although not illustrated, is identical in nature to beam imaging sensor 300 as described above.

In still yet another embodiment, a beam imaging sensor according to the present invention can utilize a set of nesting slit discs where one of the nesting slit discs has a protrusion formed thereon so as to fit into a corresponding sized notch, or indentation, in a corresponding ledge of the sensor body while the remaining member of the set of nesting slit discs could have a notch, or indentation, formed therein so as to receive a corresponding sized protrusion in a corresponding ledge of the sensor body. Thus, this embodiment is a combination of FIGS. 13 and 14 where one slit disc of the set of nesting slit discs is designed as illustrated in FIG. 13 and the other slit disc of the set of nesting slit discs is designed as illustrated in FIG. 14. In still another embodiment, the position of the protrusion/notch combinations of FIGS. 13 and 14 along the circumferential edges of the slit discs and/or sensor body ledges is not critical so long each of the nesting slit discs of these embodiments can only be positioned in one orientation the beam sensor of the present invention. That is, although FIGS. 13 and 14 illustrate the respective protrusion/notch combinations at roughly one o'clock and seven o'clock, such any one or more combinations of protrusions/notches could be moved in any amount clockwise or counterclockwise along the various circumferential edges described above. Given the above, the various protrusion/notch combinations of the embodiments of FIGS. 13 and 14 permit the nesting slit discs of the present invention to be more accurately oriented with respect to not only one another but with respect to the overall design of the beam imaging sensor of the present invention.

In still another embodiment, any one or more of the protrusion/notch combinations described above could be replaced by a pin/hole combination, where the pin would be a protrusion formed along the circumferential outer edge of an outer slit disc of the present invention and would fit into a corresponding hole formed in the outer ledge of the sensor body of the beam imaging sensor. Regarding the inner slit disc in this embodiment, the inner slit disc would have a pin formed along the circumferential inner edge of an inner slit disc of the present invention and would fit into a corresponding hole formed in the inner ledge of the sensor body of the beam imaging sensor. This pin/hole arrangement also permits the nesting slit discs of the present invention to be more accurately oriented with respect to not only one another but with respect to the overall design of the beam imaging sensor of the present invention. In still yet another embodiment, the pin could be formed in the inner ledge and/or outer ledge of the channel of the sensor body and a corresponding hole formed in the respective slit disc. As would be appreciated upon reading and understanding the embodiments of this paragraph as well as those of FIGS. 13 and 14, such embodiments are not limited to solely a circular, or cylindrically-shaped, sensor body, or even a circular slit 332. Rather, the embodiments of this paragraph, as well as those of FIGS. 13 and 14, can be applied to any of the beam imaging sensor embodiments of described herein. Additionally, although the various protrusions of the embodiments of FIGS. 13 and 14 are shown as semi-circular protrusions any suitable shape can be utilized in these embodiments. That is, the protrusions of the embodiments of FIGS. 13 and 14 can be any desired geometrical shape not just the semi-circular shape illustrated in FIGS. 13 and 14.

Figure 15:
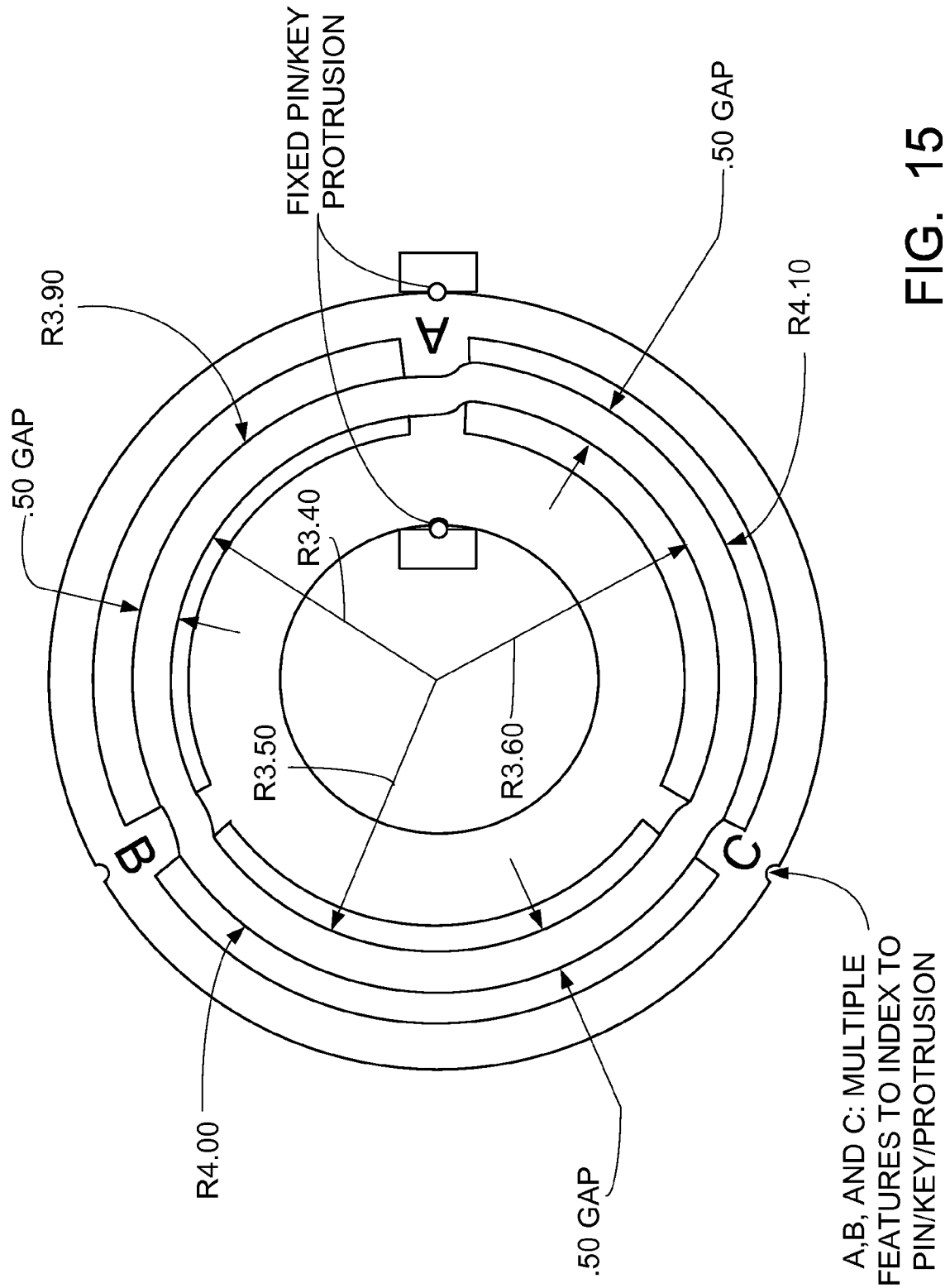
Figure 16:
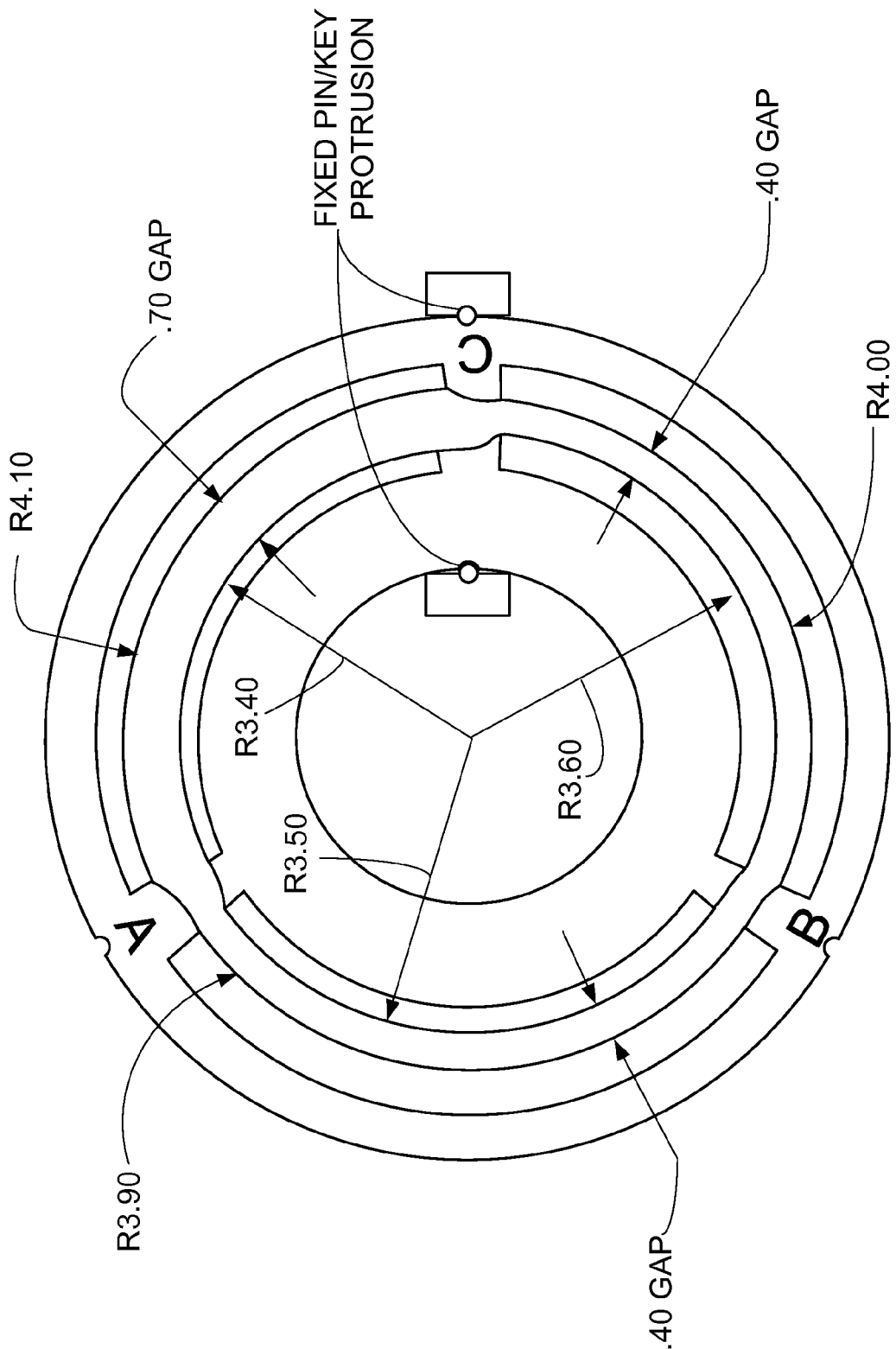

Turning to FIGS. 15 through 17, FIGS. 15 through 17 are more detailed illustration of the nesting slit discs of the present invention when it is, as discussed above, desired to have various arc segments, or lobes, formed on the inner and outer slit discs (324 and 326, respectively) so as to enable one to produce a slit 332a that has to ability to have a variety of slit widths over a given set of segments of the complete slit path. As can be seen from FIGS. 15 through 17, a set of inner and outer slit discs 324c and 326c, respectively, along with a fixed pin and/or key protrusion 950 and clocking locations 952 (which are labeled A, B and C relative to both the inner slit disc 324c and the outer slit disc 326c) are illustrated. As can be seen in FIG. 15, when the inner and outer slit discs 324c and 326c, respectively, are aligned or clocked such that the As, Bs and Cs of each disc align with the same letter on the other disc, the width of slit 332c along its entire length is constant even though the radius of the various arc segments vary as noted by the R numbers of FIG. 15. Turning to FIG. 16, when with outer slit disc 326c is rotated 120 degrees counterclockwise, the width of slit 332d that is formed by the nesting slit discs 324c and 326c changes in the three 120 degree arc segments. As can be seen from FIG. 16, the width of the gap (or slit) between A-C (the labels refer to the letters of outer slit disc 326c) changes from 0.5 inches to 0.7 inches, while the two remaining slit widths between A-B and B-C (the labels refer to the letters of outer slit disc 326c) change from 0.5 inches to 0.4 inches. Regarding fixed pin and/or key protrusion 950, this feature of the embodiment of FIGS. 15 through 17 permits locking of slit discs 324c and 326c in the various positions discussed above such that the a 332c, 332d and/or 332e having the ability to have a fixed or variable slit width along the totality of the slit 332c, 332d, and/or 332e can be achieved.

Turning to FIG. 17, when with outer slit disc 326c is rotated 240 degrees counterclockwise, the width of slit 332e that is formed by the nesting slit discs 324c and 326c changes in the three 120 degree arc segments. As can be seen from FIG. 17, the slit width of segment A-C changes from 0.5 inches to 0.6 inches, while the slit width of segment A-B changes from 0.5 inches to 0.3 inches, and the slit width of segment B-C changes from 0.5 inches to 0.6 inches (the labels refer to the letters of outer slit disc 326c). Again, fixed pin and/or key protrusion 950 permits locking of slit discs 324c and 326c in the various positions discussed above such that 332e having the widths discussed above can be achieved.

Regarding the embodiments of FIGS. 15 through 17 of the present invention, it should be noted that these embodiments are not limited to the dimensions illustrated therein. Nor are these embodiments limited to three arc segments. Instead, any number of arc segments numbering two or more can be realized. Additionally, the arc segments do not necessarily have to be of equal length (that is a number that is a whole number factor of 360). In still another instance, the embodiments of FIGS. 15 through 17 could be applied to a slit having a geometrical shape other than the circular shape illustrated in FIGS. 15 through 17.

While specific embodiments of the present invention have been shown and described in detail to illustrate the application and principles of the invention, it will be understood that it is not intended that the present invention be limited thereto and that the invention may be embodied otherwise without departing from such principles. In some embodiments of the invention, certain features of the invention may sometimes be used to advantage without a corresponding use of the other features. Accordingly, all such changes and embodiments properly fall within the scope of the following claims.

What is claimed is:

1. A beam imaging sensor comprising:
    a cylindrically-shaped sensor body, wherein the sensor body has a top end and a bottom end, the top end having at least one channel formed therein;
    a Faraday cup located within the at least one channel, the Faraday cup being positioned to receive at least a portion of an electron, or ion, beam;
    an inner slit-forming disc and an outer slit-forming disc positioned at the top end of the at least one channel so as to be positioned above the Faraday cup, the inner and outer slit-forming discs being able to nest together to form a slit there between and where the slit so formed permits passage of at least a portion of an electron, or ion, beam to the Faraday cup located there below; and
    at least one conductive lead in electrical communication with the Faraday cup, the at least one conductive lead being able to conduct an electrical signal generated by the portion of the beam that comes into contact with the Faraday cup,
    wherein the combination of the Faraday cup, the inner slit-forming disc and the outer slit-forming disc form a beam path from the outside of the beam imaging sensor to the Faraday cup that is parallel to the central axis of the cylindrically-shaped sensor body such that the portion of the electron, or ion, beam must be parallel to the central axis of the cylindrically-shaped sensor body to enter the beam path.

2. The beam imaging sensor of claim 1, wherein the beam imaging sensor further comprises:
    a cylindrically-shaped electronics enclosure, wherein the electronics enclosure has a top end and a bottom end, the top end of the electronics enclosure being coupled to the bottom end of the sensor body.

3. The beam imaging sensor of claim 2, wherein the beam imaging sensor further comprises:
    a cylindrically-shaped clamp ring body and a cylindrically-shaped lower clamp ring, wherein the clamp ring body and the clamp ring are coupled to one another and together have a top end and a bottom end, the top end of the coupled structure being coupled to the bottom end of the electronics enclosure.

4. The beam imaging sensor of claim 1, wherein the sensor body is formed from a metal or metal alloy.

5. The beam imaging sensor of claim 1, wherein the sensor body is formed from aluminum, titanium, stainless steel, martensitic stainless steel, duplex and/or super duplex stainless steel; high austenitic alloys, nickel-based alloys, or titanium alloys.

6. The beam imaging sensor of claim 1, wherein the Faraday cup is formed from a conductive metal or conductive metal alloy.

7. The beam imaging sensor of claim 1, wherein the Faraday cup is formed from copper, silver, gold, platinum, aluminum, or a conductive metal alloy that contains one or more of copper, silver, gold, platinum, or aluminum.

8. The beam imaging sensor of claim 1, wherein the inner and outer slit-forming discs are formed from a metal, metal alloy, or refractory material.

9. The beam imaging sensor of claim 1, wherein the inner and outer slit-forming discs are formed from tungsten, molybdenum, hafnium, or an alloy that contains one or more of tungsten, molybdenum, or hafnium.

10. The beam imaging sensor of claim 2, wherein the electronics enclosure is formed from an electrically non-conductive material.

11. The beam imaging sensor of claim 2, wherein the electronics enclosure is formed from an organic-based or inorganic-based insulating compound, a glass-epoxy insulator, a ceramic insulator, or any combination of two or more thereof.

12. The beam imaging sensor of claim 3, wherein the clamp ring body and lower clamp ring are independently formed from a metal or metal alloy.

13. The beam imaging sensor of claim 3, wherein the clamp ring body and lower clamp ring are independently formed from a corrosion resistant metal or corrosion resistant metal alloy.

14. The beam imaging sensor of claim 3, wherein the clamp ring body and lower clamp ring are independently formed from aluminum, titanium, stainless steel, martensitic stainless steel, duplex and/or super duplex stainless steel; high austenitic alloys, nickel-based alloys, and/or titanium alloys.

15. The beam imaging sensor of claim 1, wherein the slit formed between the inner and outer slit-forming discs has a width of less than or equal to 0.010 inches.

16. The beam imaging sensor of claim 1, wherein the slit formed between the inner and outer slit-forming discs has a width of less than or equal to 0.005 inches.

17. The beam imaging sensor of claim 1, wherein the slit formed between the inner and outer slit-forming discs has a width of less than or equal to 0.002 inches.

18. The beam imaging sensor of claim 1, wherein the slit is substantially circular in shape.

19. The beam imaging sensor of claim 1, wherein the slit is polygonal in shape.

20. The beam imaging sensor of claim 1, wherein the slit is elliptical in shape.

21. The beam imaging sensor of claim 1, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via respective threaded arrangements.

22. The beam imaging sensor of claim 1, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via respective clamps.

23. The beam imaging sensor of claim 1, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via a combination of one threaded arrangement and one clamp arrangement.

24. The beam imaging sensor of claim 23, wherein the clamp arrangement is utilized to secure the outer clamp ring to the sensor body and the threaded arrangement is utilized to secure the inner clamp ring to the sensor body.

25. The beam imaging sensor of claim 23, wherein the clamp arrangement is utilized to secure the inner clamp ring to the sensor body and the threaded arrangement is utilized to secure the outer clamp ring to the sensor body.

26. A beam imaging sensor comprising:
a cylindrically-shaped sensor body, wherein the sensor body has a top end and a bottom end, the top end having at least one channel formed therein;
a cylindrically-shaped electronics enclosure, wherein the electronics enclosure has a top end and a bottom end, the top end of the electronics enclosure being coupled to the bottom end of the sensor body;
a Faraday cup located within the at least one channel, the Faraday cup being positioned to receive at least a portion of an electron, or ion, beam;
an inner slit-forming disc and an outer slit-forming disc positioned at the top end of the at least one channel so as to be positioned above the Faraday cup, the inner and outer slit-forming discs being able to nest together to form a slit there between and where the slit so formed permits passage of at least a portion of an electron, or ion, beam to the Faraday cup located there below; and
at least one conductive lead in electrical communication with the Faraday cup, the at least one conductive lead being able to conduct an electrical signal generated by the portion of the beam that comes into contact with the Faraday cup,
wherein the combination of the Faraday cup, the inner slit-forming disc and the outer slit-forming disc form a beam path from the outside of the beam imaging sensor to the Faraday cup that is parallel to the central axis of the cylindrically-shaped sensor body such that the portion of the electron, or ion, beam must be parallel to the central axis of the cylindrically-shaped sensor body to enter the beam path.

27. The beam imaging sensor of claim 26, wherein the beam imaging sensor further comprises:
a cylindrically-shaped clamp ring body and a cylindrically-shaped lower clamp ring, wherein the clamp ring body and the clamp ring are coupled to one another and together have a top end and a bottom end, the top end of the coupled structure being coupled to the bottom end of the electronics enclosure.

28. The beam imaging sensor of claim 26, wherein the sensor body is formed from aluminum, titanium, stainless steel, martensitic stainless steel, duplex and/or super duplex stainless steel; high austenitic alloys, nickel-based alloys, or titanium alloys.

29. The beam imaging sensor of claim 26, wherein the Faraday cup is formed from copper, silver, gold, platinum, aluminum, or a conductive metal alloy that contains one or more of copper, silver, gold, platinum, or aluminum.

30. The beam imaging sensor of claim 26, wherein the inner and outer slit-forming discs are formed from tungsten, molybdenum, hafnium, or an alloy that contains one or more of tungsten, molybdenum, or hafnium.

31. The beam imaging sensor of claim 26, wherein the electronics enclosure is formed from an organic-based or inorganic-based insulating compound, a glass-epoxy insulator, a ceramic insulator, or any combination of two or more thereof.

32. The beam imaging sensor of claim 27, wherein the clamp ring body and lower clamp ring are independently formed from aluminum, titanium, stainless steel, martensitic stainless steel, duplex and/or super duplex stainless steel; high austenitic alloys, nickel-based alloys, and/or titanium alloys.

33. The beam imaging sensor of claim 26, wherein the slit is substantially circular in shape.

34. The beam imaging sensor of claim 26, wherein the slit is polygonal in shape.

35. The beam imaging sensor of claim 26, wherein the slit is elliptical in shape.

36. The beam imaging sensor of claim 26, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via respective threaded arrangements.

37. The beam imaging sensor of claim 26, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via respective clamps.

38. The beam imaging sensor of claim 37, wherein two or more clamps are utilized to secure each of inner clamp ring and outer clamp ring to the sensor body.

39. The beam imaging sensor of claim 38, wherein the two or more clamps that are utilized to secure each of inner clamp ring and outer clamp ring to the sensor body are equally spaced around the circumferential inner and outer surfaces of the sensor body.

40. The beam imaging sensor of claim 37, wherein three or more clamps are utilized to secure each of inner clamp ring and outer clamp ring to the sensor body.

41. The beam imaging sensor of claim 40, wherein the three or more clamps that are utilized to secure each of inner clamp ring and outer clamp ring to the sensor body are equally spaced around the circumferential inner and outer surfaces of the sensor body.

42. The beam imaging sensor of claim 37, wherein four or more clamps are utilized to secure each of inner clamp ring and outer clamp ring to the sensor body.

43. The beam imaging sensor of claim 42, wherein the four or more clamps that are utilized to secure each of inner clamp ring and outer clamp ring to the sensor body are equally spaced around the circumferential inner and outer surfaces of the sensor body.

44. The beam imaging sensor of claim 26, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via a combination of one threaded arrangement and one clamp arrangement.

45. The beam imaging sensor of claim 44, wherein the clamp arrangement is utilized to secure the outer clamp ring to the sensor body and the threaded arrangement is utilized to secure the inner clamp ring to the sensor body.

46. The beam imaging sensor of claim 44, wherein the clamp arrangement is utilized to secure the inner clamp ring to the sensor body and the threaded arrangement is utilized to secure the outer clamp ring to the sensor body.

47. A beam imaging sensor comprising:
a cylindrically-shaped sensor body, wherein the sensor body has a top end and a bottom end, the top end having at least one channel formed therein;
a cylindrically-shaped electronics enclosure, wherein the electronics enclosure has a top end and a bottom end, the top end of the electronics enclosure being coupled to the bottom end of the sensor body;
a cylindrically-shaped clamp ring body and a cylindrically-shaped lower clamp ring, wherein the clamp ring body and the clamp ring are coupled to one another and together have a top end and a bottom end, the top end of the coupled structure being coupled to the bottom end of the electronics enclosure;
a Faraday cup located within the at least one channel, the Faraday cup being positioned to receive at least a portion of an electron, or ion, beam;
an inner slit-forming disc and an outer slit-forming disc positioned at the top end of the least the at least one channel so as to be positioned above the Faraday cup, the inner and outer slit-forming discs being able to nest together to form a slit there between and where the slit so formed permits passage of at least a portion of an electron, or ion, beam to the Faraday cup located there below; and
at least one conductive lead in electrical communication with the Faraday cup, the at least one conductive lead being able to conduct an electrical signal generated by the portion of the beam that comes into contact with the Faraday cup,
wherein the combination of the Faraday cup, the inner slit-forming disc and the outer slit-forming disc form a beam path from the outside of the beam imaging sensor to the Faraday cup that is parallel to the central axis of the cylindrically-shaped sensor body such that the portion of the electron, or ion, beam must be parallel to the central axis of the cylindrically-shaped sensor body to enter the beam path.

48. The beam imaging sensor of claim 47, wherein the sensor body is formed from aluminum, titanium, stainless steel, martensitic stainless steel, duplex and/or super duplex stainless steel; high austenitic alloys, nickel-based alloys, or titanium alloys.

49. The beam imaging sensor of claim 47, wherein the Faraday cup is formed from copper, silver, gold, platinum, aluminum, or a conductive metal alloy that contains one or more of copper, silver, gold, platinum, or aluminum.

50. The beam imaging sensor of claim 47, wherein the inner and outer slit-forming discs are formed from tungsten, molybdenum, hafnium, or an alloy that contains one or more of tungsten, molybdenum, or hafnium.

51. The beam imaging sensor of claim 47, wherein the electronics enclosure is formed from an organic-based or inorganic-based insulating compound, a glass-epoxy insulator, a ceramic insulator, or any combination of two or more thereof.

52. The beam imaging sensor of claim 47, wherein the clamp ring body and lower clamp ring are independently formed from aluminum, titanium, stainless steel, martensitic stainless steel, duplex and/or super duplex stainless steel; high austenitic alloys, nickel-based alloys, and/or titanium alloys.

53. The beam imaging sensor of claim 47, wherein the slit formed between the inner and outer slit-forming discs has a width of less than or equal to 0.002 inches.

54. The beam imaging sensor of claim 47, wherein the slit is substantially circular in shape.

55. The beam imaging sensor of claim 47, wherein the slit is polygonal in shape.

56. The beam imaging sensor of claim 47, wherein the slit is elliptical in shape.

57. The beam imaging sensor of claim 47, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via respective threaded arrangements.

58. The beam imaging sensor of claim 47, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via respective clamps.

59. The beam imaging sensor of claim 58, wherein two or more clamps are utilized to secure each of inner clamp ring and outer clamp ring to the sensor body.

60. The beam imaging sensor of claim 59, wherein the two or more clamps that are utilized to secure each of inner clamp ring and outer clamp ring to the sensor body are equally spaced around the circumferential inner and outer surfaces of the sensor body.

61. The beam imaging sensor of claim 58, wherein three or more clamps are utilized to secure each of inner clamp ring and outer clamp ring to the sensor body.

62. The beam imaging sensor of claim 61, wherein the three or more clamps that are utilized to secure each of inner clamp ring and outer clamp ring to the sensor body are equally spaced around the circumferential inner and outer surfaces of the sensor body.

63. The beam imaging sensor of claim 58, wherein four or more clamps are utilized to secure each of inner clamp ring and outer clamp ring to the sensor body.

64. The beam imaging sensor of claim 63, wherein the four or more clamps that are utilized to secure each of inner clamp ring and outer clamp ring to the sensor body are equally spaced around the circumferential inner and outer surfaces of the sensor body.

65. The beam imaging sensor of claim 47, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via a combination of one threaded arrangement and one clamp arrangement.

66. The beam imaging sensor of claim 65, wherein the clamp arrangement is utilized to secure the outer clamp ring to the sensor body and the threaded arrangement is utilized to secure the inner clamp ring to the sensor body.

67. The beam imaging sensor of claim 65, wherein the clamp arrangement is utilized to secure the inner clamp ring to the sensor body and the threaded arrangement is utilized to secure the outer clamp ring to the sensor body.

68. A beam imaging sensor comprising:
a sensor body, wherein the sensor body has a top end and a bottom end, the top end having at least one channel formed therein;
a Faraday cup located within the at least one channel, the Faraday cup being positioned to receive at least a portion of an electron, or ion, beam;
an inner slit-forming disc and an outer slit-forming disc positioned at the top end of the at least one channel so as to be positioned above the Faraday cup, the inner and outer slit-forming discs being able to nest together to form a slit there between and where the slit so formed permits passage of at least a portion of an electron, or ion, beam to the Faraday cup located there below; and
at least one conductive lead in electrical communication with the Faraday cup, the at least one conductive lead being able to conduct an electrical signal generated by the portion of the beam that comes into contact with the Faraday cup,
wherein the combination of the Faraday cup, the inner slit-forming disc and the outer slit-forming disc form a beam path from the outside of the beam imaging sensor to the Faraday cup that is parallel to the central axis of the sensor body such that the portion of the electron, or ion, beam must be parallel to the central axis of the sensor body to enter the beam path.

69. The beam imaging sensor of claim 68, wherein the beam imaging sensor further comprises:
an electronics enclosure, wherein the electronics enclosure has a top end and a bottom end, the top end of the electronics enclosure being coupled to the bottom end of the sensor body.

70. The beam imaging sensor of claim 69, wherein the beam imaging sensor further comprises:
a clamp ring body and a lower clamp ring, wherein the clamp ring body and the clamp ring are coupled to one another and together have a top end and a bottom end, the top end of the coupled structure being coupled to the bottom end of the electronics enclosure.

71. The beam imaging sensor of claim 68, wherein the sensor body is formed from a metal or metal alloy.

72. The beam imaging sensor of claim 68, wherein the sensor body is formed from aluminum, titanium, stainless steel, martensitic stainless steel, duplex and/or super duplex stainless steel; high austenitic alloys, nickel-based alloys, or titanium alloys.

73. The beam imaging sensor of claim 68, wherein the Faraday cup is formed from a conductive metal or conductive metal alloy.

74. The beam imaging sensor of claim 68, wherein the Faraday cup is formed from copper, silver, gold, platinum, aluminum, or a conductive metal alloy that contains one or more of copper, silver, gold, platinum, or aluminum.

75. The beam imaging sensor of claim 68, wherein the inner and outer slit-forming discs are formed from a metal, metal alloy, or refractory material.

76. The beam imaging sensor of claim 68, wherein the inner and outer slit-forming discs are formed from tungsten, molybdenum, hafnium, or an alloy that contains one or more of tungsten, molybdenum, or hafnium.

77. The beam imaging sensor of claim 69, wherein the electronics enclosure is formed from an electrically non-conductive material.

78. The beam imaging sensor of claim 69, wherein the electronics enclosure is formed from an organic-based or inorganic-based insulating compound, a glass-epoxy insulator, a ceramic insulator, or any combination of two or more thereof.

79. The beam imaging sensor of claim 70, wherein the clamp ring body and lower clamp ring are independently formed from a metal or metal alloy.

80. The beam imaging sensor of claim 70, wherein the clamp ring body and lower clamp ring are independently formed from a corrosion resistant metal or corrosion resistant metal alloy.

81. The beam imaging sensor of claim 70, wherein the clamp ring body and lower clamp ring are independently formed from aluminum, titanium, stainless steel, martensitic stainless steel, duplex and/or super duplex stainless steel; high austenitic alloys, nickel-based alloys, and/or titanium alloys.

82. The beam imaging sensor of claim 68, wherein the slit formed between the inner and outer slit-forming discs has a width of less than or equal to 0.010 inches.

83. The beam imaging sensor of claim 68, wherein the slit formed between the inner and outer slit-forming discs has a width of less than or equal to 0.005 inches.

84. The beam imaging sensor of claim 68, wherein the slit formed between the inner and outer slit-forming discs has a width of less than or equal to 0.002 inches.

85. The beam imaging sensor of claim 68, wherein the slit is substantially circular in shape.

86. The beam imaging sensor of claim 68, wherein the slit is polygonal in shape.

87. The beam imaging sensor of claim 68, wherein the slit is elliptical in shape.

88. The beam imaging sensor of claim 68, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via respective threaded arrangements.

89. The beam imaging sensor of claim 68, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via respective clamps.

90. The beam imaging sensor of claim 68, wherein the inner slit-forming disc and the outer slit-forming disc are secured to the at least one channel in the top end of the sensor body via an inner clamp ring and an outer clamp ring, wherein the inner clamp ring and the outer clamp ring are secured to respective surfaces of the sensor body via a combination of one threaded arrangement and one clamp arrangement.

91. The beam imaging sensor of claim 90, wherein the clamp arrangement is utilized to secure the outer clamp ring to the sensor body and the threaded arrangement is utilized to secure the inner clamp ring to the sensor body.

92. The beam imaging sensor of claim 90, wherein the clamp arrangement is utilized to secure the inner clamp ring to the sensor body and the threaded arrangement is utilized to secure the outer clamp ring to the sensor body.

93. The beam imaging sensor of claim 68, wherein the sensor body of the beam imaging sensor is formed in any geometric shape selected from circular, polygonal, irregular polygonal, elliptical, arcuate, or semicircular.

94. The beam imaging sensor of claim 93, wherein the sensor body of the beam imaging sensor is circular in shape.

95. The beam imaging sensor of claim 93, wherein the sensor body of the beam imaging sensor is polygonal in shape.

96. The beam imaging sensor of claim 68, wherein the Faraday cup is a modified Faraday cup and wherein the modified Faraday cup comprises a cross-sectional profile similar in shape to a human nose.

97. The beam imaging sensor of claim 68, wherein the Faraday cup is a modified Faraday cup and wherein the modified Faraday cup is circular in shape when viewed from the surface through which the electron, or ion, beam enters, and wherein the cross-section of the modified Faraday cup is formed from one substantially straight internal sidewall, one sloped internal sidewall, a sloped bottom, and an open top.

98. The beam imaging sensor of claim 68, wherein the Faraday cup is a modified Faraday cup and wherein the modified Faraday cup is circular in shape when viewed from the surface through which the electron, or ion, beam enters, and wherein the cross-section of the modified Faraday cup is formed from one substantially straight internal sidewall, one sloped internal sidewall, a sloped bottom, and an open top, and wherein the one sloped internal sidewall has a slope of between about 5 degrees and about 25 degrees.

99. The beam imaging sensor of claim 68, wherein the Faraday cup is a modified Faraday cup and wherein the modified Faraday cup is circular in shape when viewed from the surface through which the electron, or ion, beam enters, and wherein the cross-section of the modified Faraday cup is formed from one substantially straight internal sidewall, one sloped internal sidewall, a sloped bottom, and an open top, and wherein the sloped bottom has a slope of between about 5 degrees and about 35 degrees.

100. The beam imaging sensor of claim 68, wherein the Faraday cup is a modified Faraday cup and wherein the modified Faraday cup is circular in shape when viewed from the surface through which the electron, or ion, beam enters, and wherein the cross-section of the modified Faraday cup is formed from one substantially straight internal sidewall, one sloped internal sidewall, a sloped bottom, and an open top, and wherein the modified Faraday cup has a minimum depth of at least about 0.25 inches.

101. The beam imaging sensor of claim 68, wherein the inner slit-forming disc has at least one protrusion formed thereon so as to permit orientation of the inner slit-forming disc into the at least one channel of the sensor body in only one manner due to the at least one channel formed therein having a corresponding notch designed to receive the at least one protrusion of the inner slit-forming disc.

102. The beam imaging sensor of claim 101, wherein the outer slit-forming disc has at least one protrusion formed thereon so as to permit orientation of the outer slit-forming disc into the at least one channel of the sensor body in only one manner due to the at least one channel formed therein having a corresponding notch designed to receive the at least one protrusion of the outer slit-forming disc.

103. The beam imaging sensor of claim 68, wherein the outer slit-forming disc has at least one protrusion formed thereon so as to permit orientation of the outer slit-forming disc into the at least one channel of the sensor body in only one manner due to the at least one channel formed therein having a corresponding notch designed to receive the at least one protrusion of the outer slit-forming disc.

104. The beam imaging sensor of claim 68, wherein the outer slit-forming disc has at least one notch formed thereon so as to permit orientation of the outer slit-forming disc into the at least one channel of the sensor body in only one manner due to the at least one channel formed therein having a corresponding protrusion designed to receive the at least one notch of the outer slit-forming disc.

105. The beam imaging sensor of claim 68, wherein the inner slit-forming disc has at least one notch formed therein so as to permit orientation of the inner slit-forming disc into the at least one channel of the sensor body in only one manner due to the at least one channel formed therein having a corresponding protrusion designed to fit into the at least one notch of the inner slit-forming disc.

106. The beam imaging sensor of claim 105, wherein the outer slit-forming disc has at least one protrusion formed thereon so as to permit orientation of the outer slit-forming disc into the at least one channel of the sensor body in only one manner due to the at least one channel formed therein having a corresponding notch designed to receive the at least one protrusion of the outer slit-forming disc.

107. The beam imaging sensor of claim 105, wherein the outer slit-forming disc has at least one notch formed thereon so as to permit orientation of the outer slit-forming disc into the at least one channel of the sensor body in only one manner due to the at least one channel formed therein having a corresponding protrusion designed to receive the at least one notch of the outer slit-forming disc.

108. The beam imaging sensor of claim 101, wherein the outer slit-forming disc has at least one notch formed thereon so as to permit orientation of the outer slit-forming disc into the at least one channel of the sensor body in only one manner due to the at least one channel formed therein having a corresponding notch protrusion designed to receive the at least one notch of the outer slit-forming disc.

109. The beam imaging sensor of claim 68, wherein the inner and outer slit-forming discs have at least one set of alignment indicia formed thereon and wherein the at least one set of alignment indicia permit a user to accurately align the inner and outer slit-forming discs in one particular orientation.

110. The beam imaging sensor of claim 109, wherein the at least one set of alignment indicia is selected from any suitable combination of two or more dots, two or more circles, two or more Xs, two or more like or different letters, two or more like or different numbers, or two or more arrows.

111. The beam imaging sensor of claim 68, wherein the slit formed by the inner slit-forming disc and the outer slit-forming disc has at least two different slit widths along the length of the slit.

* * * * *